(12) United States Patent
Kato et al.

(10) Patent No.: US 10,403,664 B2
(45) Date of Patent: Sep. 3, 2019

(54) PHOTOELECTRIC CONVERSION APPARATUS AND IMAGING SYSTEM

(71) Applicant: CANON KABUSHIKI KAISHA, Tokyo (JP)

(72) Inventors: Taro Kato, Kawasaki (JP); Jun Iba, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 247 days.

(21) Appl. No.: 14/726,148

(22) Filed: May 29, 2015

(65) Prior Publication Data

US 2015/0349011 A1 Dec. 3, 2015

(30) Foreign Application Priority Data

Jun. 2, 2014 (JP) ................ 2014-114433

(51) Int. Cl.
| | |
|---|---|
| G02B 27/40 | (2006.01) |
| H01L 27/146 | (2006.01) |
| G02B 7/36 | (2006.01) |
| H04N 5/369 | (2011.01) |

(52) U.S. Cl.
CPC .......... *H01L 27/14625* (2013.01); *G02B 7/36* (2013.01); *H01L 27/14629* (2013.01); *H04N 5/36961* (2018.08); *H04N 5/36965* (2018.08)

(58) Field of Classification Search
CPC ........ H01L 27/14625; H01L 27/14629; G02B 7/36; H04N 5/36961; H04N 5/36965; H04N 5/3696
USPC ................. 250/208.1, 201.2, 201.4
See application file for complete search history.

(56) References Cited

U.S. PATENT DOCUMENTS

| | | | |
|---|---|---|---|
| 9,263,487 B2 | 2/2016 | Kato | |
| 2008/0135732 A1* | 6/2008 | Toumiya | H01L 27/14625 250/208.1 |
| 2009/0166518 A1 | 7/2009 | Tay | |
| 2009/0303371 A1 | 12/2009 | Watanabe et al. | |
| 2010/0265384 A1 | 10/2010 | Tay | |
| 2010/0302432 A1* | 12/2010 | Komuro | H04N 5/23212 348/340 |
| 2010/0308427 A1* | 12/2010 | Lenchenkov | H01L 27/14625 257/432 |
| 2010/0317142 A1 | 12/2010 | Tay | |

(Continued)

FOREIGN PATENT DOCUMENTS

| | | |
|---|---|---|
| CN | 102637711 A | 8/2012 |
| DE | 112012005434 B4 | 3/2017 |

(Continued)

*Primary Examiner* — Georgia Y Epps
*Assistant Examiner* — Keivn Wyatt
(74) *Attorney, Agent, or Firm* — Canon U.S.A., Inc. IP Division

(57) ABSTRACT

A photoelectric conversion apparatus has light receiving elements disposed on an imaging plane. The light receiving element includes a plurality of photoelectric conversion portions arrayed in a first direction parallel to the imaging plane, across an isolation portion, and a light guide portion extending over the plurality of photoelectric conversion portions. In a first plane which is parallel to the imaging plane and which traverses the light guide portion, a greatest width of the light guide portion in the first direction is larger than a greatest width of the light guide portion in a second direction parallel to the imaging plane and orthogonal to the first direction.

30 Claims, 12 Drawing Sheets

(56) References Cited

U.S. PATENT DOCUMENTS

| | | |
|---|---|---|
| 2011/0031381 A1 | 2/2011 | Tay |
| 2011/0102651 A1 | 5/2011 | Tay |
| 2011/0186952 A1 | 8/2011 | Toda |
| 2011/0249161 A1* | 10/2011 | Takagi ............... H01L 27/14625 348/294 |
| 2012/0038814 A1* | 2/2012 | Tayanaka .......... H01L 27/14629 348/340 |
| 2012/0133809 A1* | 5/2012 | Yamada ............ H01L 27/14623 348/294 |
| 2012/0199893 A1* | 8/2012 | Okabe ............... H01L 27/14641 257/291 |
| 2012/0200728 A1 | 8/2012 | Kobayashi et al. |
| 2012/0200751 A1 | 8/2012 | Kato et al. |
| 2013/0194471 A1* | 8/2013 | Yamashita ............. H04N 5/374 348/308 |
| 2014/0001589 A1* | 1/2014 | Fukuda ............... H01L 27/14623 257/432 |
| 2014/0091205 A1* | 4/2014 | Takamiya ......... H01L 27/14627 250/208.1 |
| 2014/0118589 A1 | 5/2014 | Numata |
| 2014/0320733 A1* | 10/2014 | Ikemoto ............. H04N 5/23212 348/348 |
| 2015/0349015 A1 | 12/2015 | Yamaguchi |
| 2017/0092677 A1* | 3/2017 | Ikakura ............. H01L 27/14625 |

FOREIGN PATENT DOCUMENTS

| | | |
|---|---|---|
| GB | 2481651 A | 1/2012 |
| JP | 2002314062 A | 10/2002 |
| JP | 2003244712 A | 8/2003 |
| JP | 2007-042801 A | 2/2007 |
| JP | 2009-158800 A | 7/2009 |
| JP | 2010-232595 A | 10/2010 |
| JP | 2011-029379 A | 2/2011 |
| JP | 2012-151215 A | 8/2012 |
| JP | 2013-150314 A | 8/2013 |
| JP | 2014-057079 A | 3/2014 |
| JP | 2014-093343 A | 5/2014 |
| JP | 2015-225939 A | 12/2015 |
| RU | 2426195 C1 | 8/2011 |
| WO | 2011001196 A1 | 1/2011 |

* cited by examiner

FIG. 2A
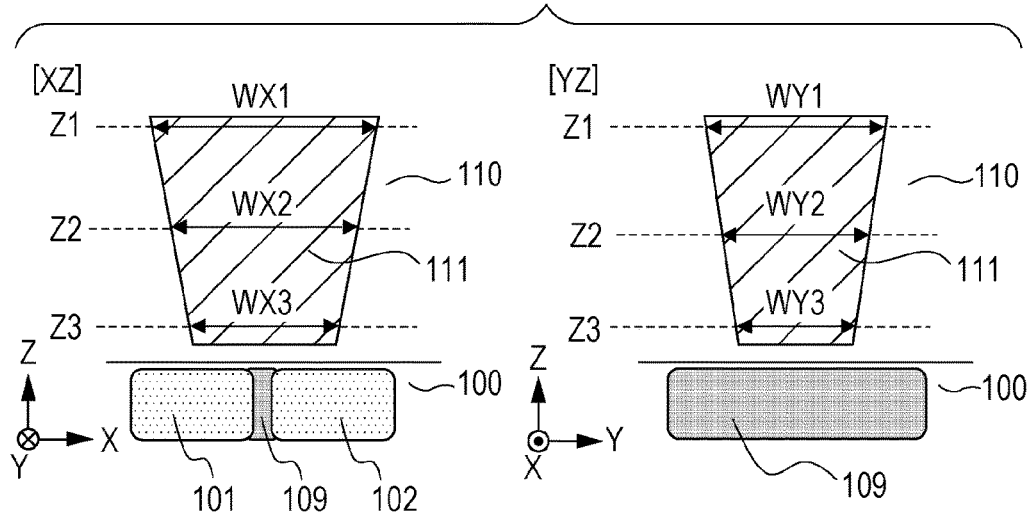
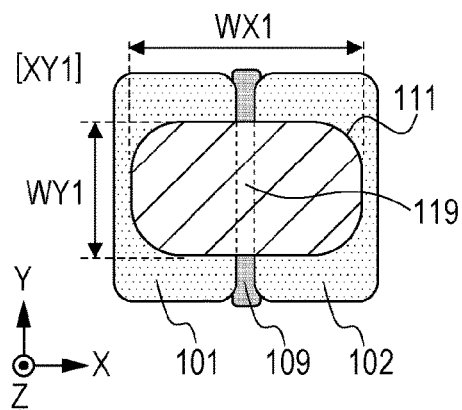
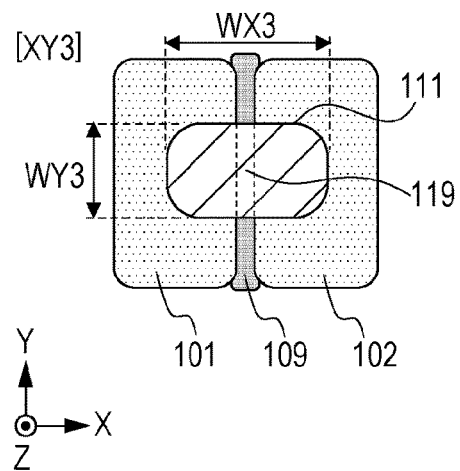

FIG. 2B
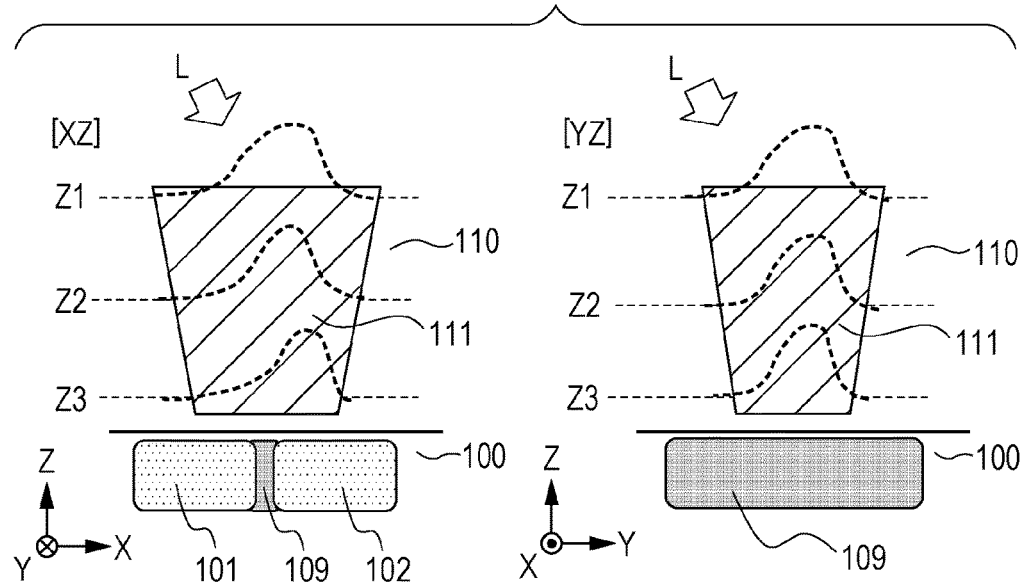
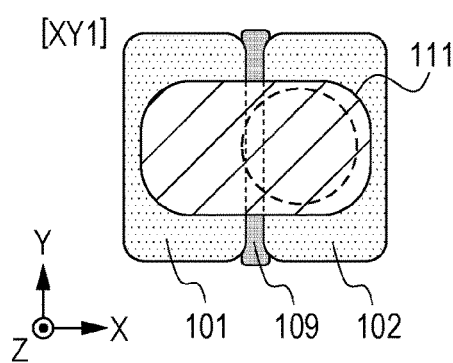
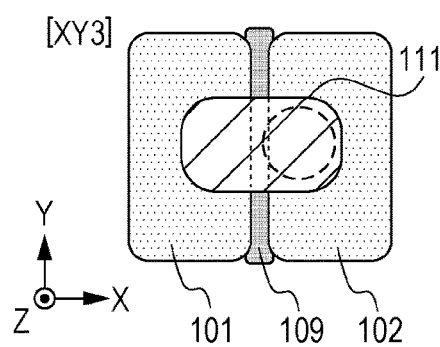

FIG. 3A
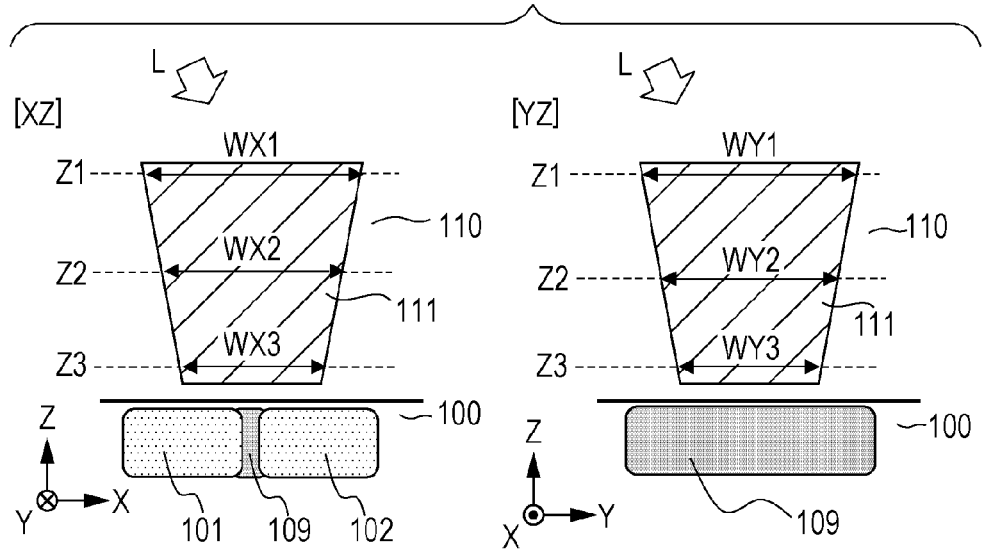
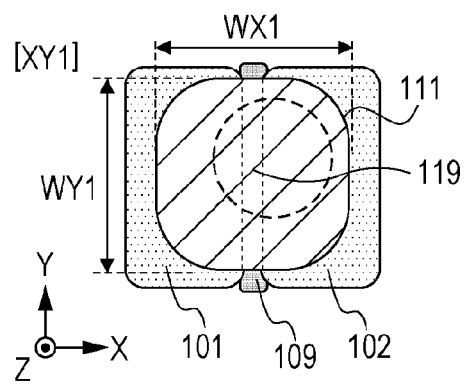
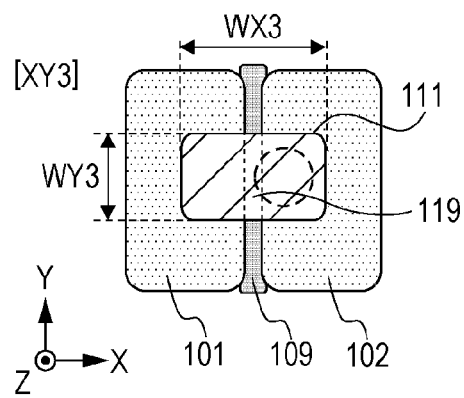

FIG. 3B
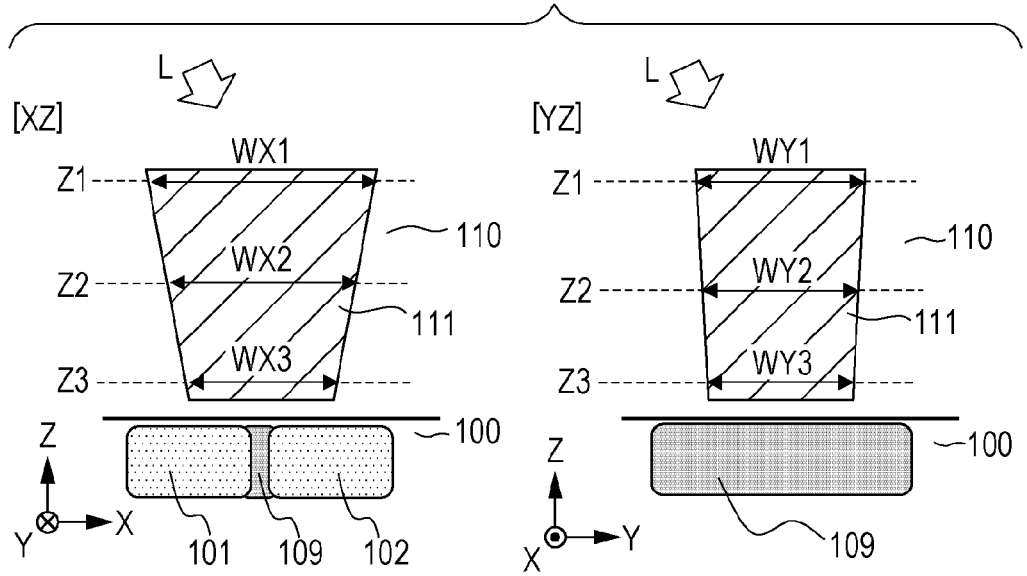
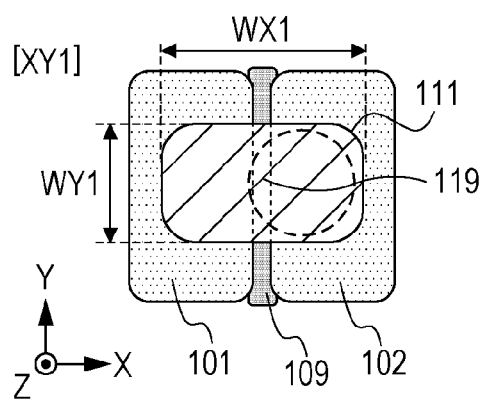
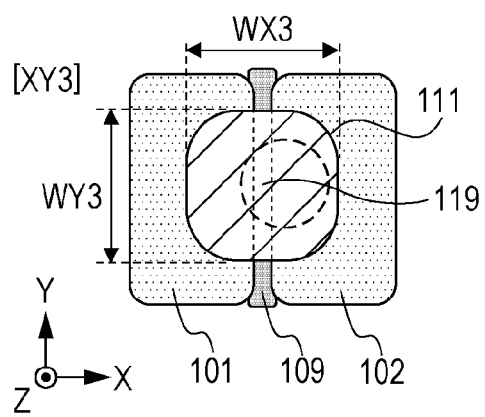

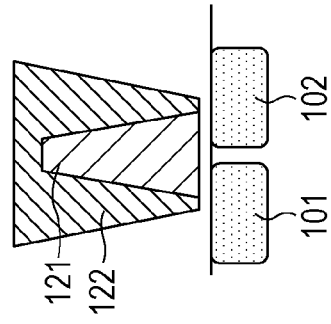
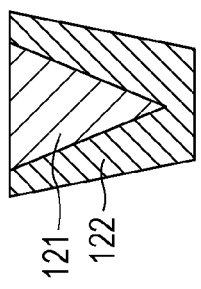
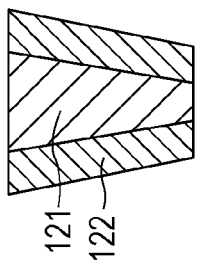
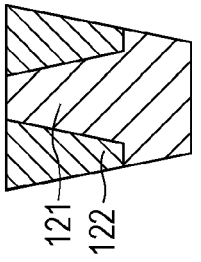
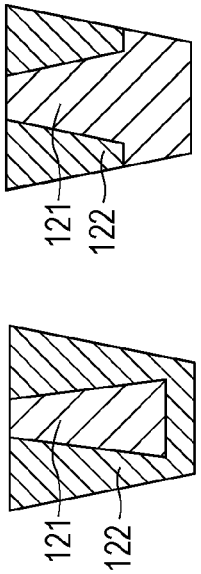
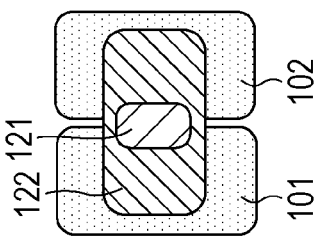
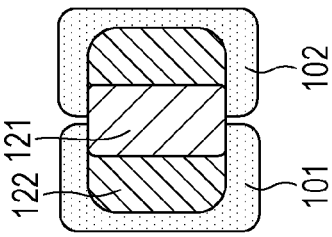
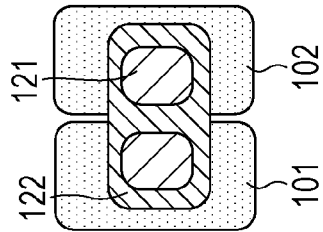
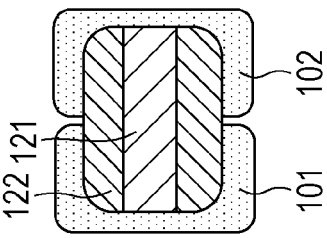
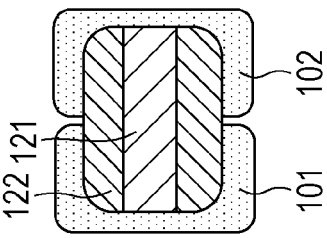

PHOTOELECTRIC CONVERSION APPARATUS AND IMAGING SYSTEM

BACKGROUND OF THE INVENTION

Field of the Invention

The present invention relates to a photoelectric conversion apparatus having a light guide unit.

Description of the Related Art

There are known photoelectric conversion apparatuses which perform focus detection by phase difference detecting, using pixels having multiple photoelectric conversion portions. A configuration where a single pixel has multiple photoelectric conversion portions is advantageous not only regarding focus detection, but also is advantageous in many points relating to improved imaging system performance, such as faster speeds due to improved transfer efficiency, a broader dynamic range, and so forth.

Japanese Patent Laid-Open No. 2009-158800 discloses a form where a gap surrounding an effective light receiving region of two photodiodes is provided in an interlayer film. Japanese Patent Laid-Open No. 2009-158800 also discloses a form where, in addition to the gap surrounding the effective light receiving region of two photodiodes, a gap is provided in the interlayer film, following the gap between the photodiodes.

The form in Japanese Patent Laid-Open No. 2009-158800 has a problem that light cannot be accurately divided to the two photodiodes.

SUMMARY OF THE INVENTION

Provided is a photoelectric conversion apparatus having a light receiving element arrayed along an imaging plane, wherein the light receiving element includes a plurality of photoelectric conversion portions arrayed in a first direction parallel to the imaging plane, across an isolation portion, and a light guide portion disposed extending over the plurality of photoelectric conversion portions, and wherein in a first plane which is parallel to the imaging plane and which traverses the light guide portion, a greatest width of the light guide portion in the first direction is larger than a greatest width of the light guide portion in a second direction parallel to the imaging plane and orthogonal to the first direction.

Further features of the present invention will become apparent from the following description of exemplary embodiments with reference to the attached drawings.

BRIEF DESCRIPTION OF THE DRAWINGS

FIGS. 2A-2B are schematic diagrams exemplarily illustrating light receiving elements.

FIGS. 3A-3B are schematic diagrams exemplarily illustrating light receiving elements.

FIGS. 8A-8J are schematic diagrams exemplarily illustrating light receiving elements.

DESCRIPTION OF THE EMBODIMENTS

Embodiment

Figure 1A:
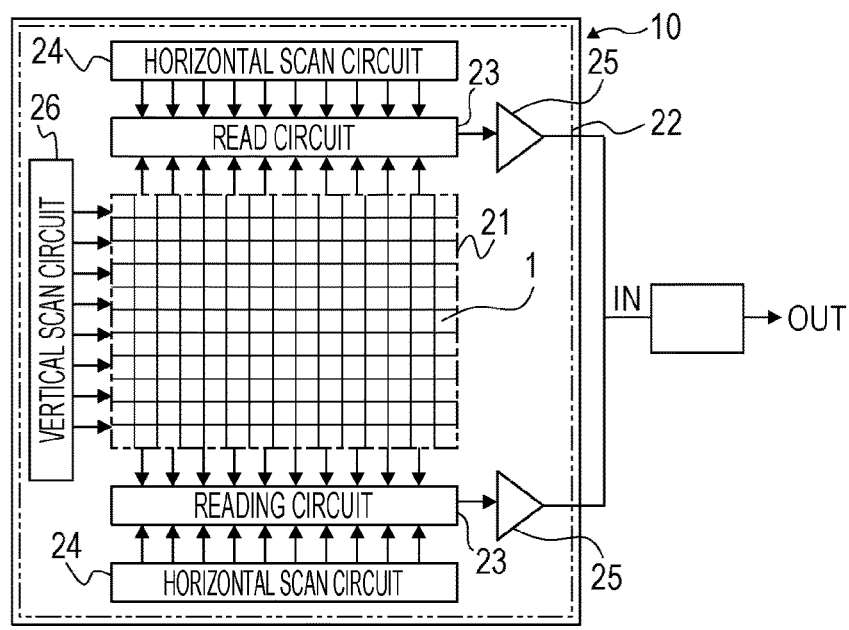
FIGS. 1A-1C are schematic diagrams exemplarily illustrating a photoelectric conversion apparatus.

The following is a description of an embodiment for carrying out the present invention. It should be noted, however, that the following description is but one embodiment of the invention, and is not restrictive. Configurations which are in common over multiple drawings are denoted with the same reference numerals in the following description and the drawings. Common configurations will be described with reference to multiple drawings, and description of configurations which have been denoted with the same reference numerals will be omitted as appropriate. Also, any suitable technology can be applied to portions which are not described below.

FIG. 1A illustrates a schematic view of a photoelectric conversion apparatus 10 as a pixel amplifying type image sensor. The photoelectric conversion apparatus 10 illustrated in FIG. 1A has a light receiving region 21 which is a region surrounded by a one-dot dashed line, and a peripheral region 22 which is a region on the periphery of the light receiving region 21, and is between the one-dot dashed line and a two-dot dashed line. Multiple light receiving elements 1 are arrayed in a matrix form or column form in the light receiving region 21. Signals from the light receiving elements at the time of forming an image by imaging make up pixels, so the light receiving region may be referred to as imaging region or pixel region. The gaps between the center axes of adjacent light receiving elements (pixel pitch) typically is 10 μm or less, preferably is 5.0 μm or less, and particularly preferably 2.0 μm or less.

The peripheral region 22 has peripheral circuits including a vertical scan circuit 26, two read circuits 23, two horizontal scan circuits 24, and two output amplifiers 25. The read circuits 23 at the peripheral region 22 are made up of a column amplifier, a correlated double sampling (CDS) circuit, an adding circuit, or the like. The read circuits 23 perform amplifying, addition, and so forth, of signals read out from pixels of rows selected by the vertical scan circuit 26 via vertical signal lines. The column amplifier, CDS circuit, adding circuit, or the like, are disposed every pixel column or every multiple pixel columns. The horizontal scan circuit 24 generates signals for reading out signals from the read circuits 23 in order. The output amplifiers 25 amplify and output the signals of columns selected by the horizontal scan circuits 24. The above-described configuration is only one configuration example of the photoelectric conversion apparatus 10 and is not restrictive. While the read circuits 23, horizontal scan circuits 24, and output amplifiers 25 make up two output path systems, and one each is disposed above and below the light receiving region 21, this is not restrictive.

Figure 1B:
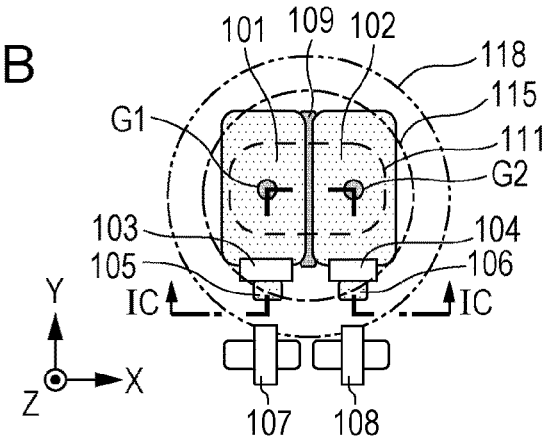
Figure 1C:
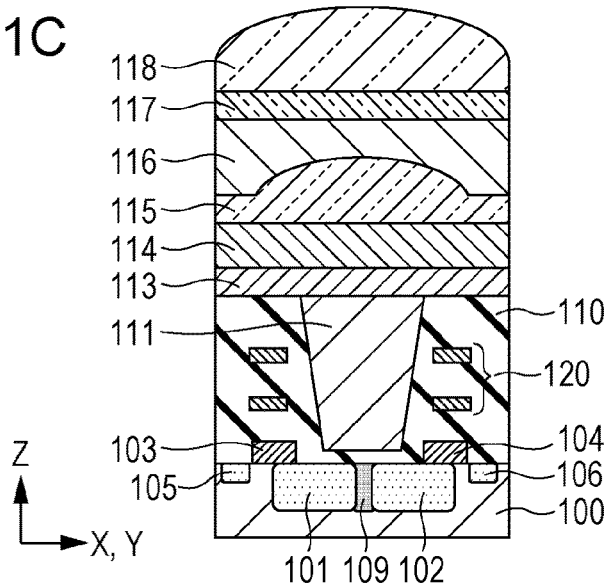

FIG. 1B is a schematic diagram illustrating an example of a light receiving element 1, and FIG. 1C is a cross-sectional schematic diagram of the light receiving element 1 taken along line IC-IC in FIG. 1B. A single light receiving element 1 has multiple photoelectric conversion portions 101 and 102 provided within a substrate 100 made of a semiconductor. An isolation portion 109 is disposed between the multiple photoelectric conversion portions 101 and 102, for isolating signal charges thereof. The isolating portion 109 may be insulating isolation by an insulator such as local oxidation of silicon (LOCOS) or shallow trench isolation (STI) or the like, or may be junction isolation by a semiconductor region of the opposite conductivity type from the accumulation regions of the photoelectric conversion portions 101 and 102. Junction isolation is used in the present example. The isolation capabilities of the isolation portion 109 may be imperfect, just as long as there are isolation properties to where determination can be made which of the signal charges generated at the photoelectric conversion portions 101 and 102 is larger. Accordingly, part of a signal charge generated at the photoelectric conversion portion 101 being detected as a signal charge generated at the photoelectric conversion portion 102 is permissible.

The photoelectric conversion portions 101 and 102 of the multiple light receiving elements 1 are arrayed within a common substrate 100 following the principal surface of the substrate 100 as an imaging plane. The direction in which the two photoelectric conversion portions 101 and 102 are arrayed across the isolation portion 109, parallel to the imaging plane, is the X direction. The direction in which the two photoelectric conversion portions 101 and 102 are arrayed can be defined as a direction parallel to a straight line connecting a geometric center-of-gravity G1 when viewing the photoelectric conversion portion 101 in plan view and a geometric center-of-gravity G2 when viewing the photoelectric conversion portion 102 in plan view. A direction parallel to the imaging plane and orthogonal to the X direction is the Y direction. The direction orthogonal to the imaging plane is the Z direction. The Z direction is orthogonal to the X direction and the Y direction. Typically, the X direction may be one of the row direction of the light receiving elements 1 arrayed in matrix form in the light receiving region 21 (direction in which one row extends) and the column direction (direction in which one column extends). Also typically, the Y direction may be the other of the row direction of the light receiving elements 1 arrayed in matrix form in the light receiving region 21 (direction along the rows) and the column direction (direction along the columns).

The photoelectric conversion portions 101 and 102 are photodiodes formed by introducing an impurity into the substrate 100 formed of a semiconductor. The photoelectric conversion portions 101 and 102 serving as photodiodes take a great number of signal charges as carriers, and are confirmed of a PN junction of a first conductivity type semiconductor region (accumulation region) for accumulating signal charges, and a second conductivity type semiconductor region. Other examples of the photoelectric conversion portions 101 and 102 include photogates, and semiconductor thin-film having a metal-insulator-semiconductor (MIS) type structure or a p-intrinsic-n (PIN) type structure formed on a substrate of an insulator such as glass or the like. The light receiving region 21 of the photoelectric conversion apparatus 10 may include, besides the light receiving elements 1, a light receiving element which has only one photoelectric conversion portion 101.

The signal charge acquired at the photoelectric conversion portion 101 is transferred to a detecting unit 105 via a transfer gate 103 having a metal-oxide semiconductor (MOS) structure, and the signal charge acquired at the photoelectric conversion portion 102 is transferred to a detecting unit 106 via a transfer gate 104 having a MOS structure. The detecting units 105 and 106 are floating diffusion portions forming electrostatic capacitance, for example. The detecting units 105 and 106 are each connected to an amplifying transistor 107 and a reset transistor 108. While a configuration has been illustrated here where detecting units are provided to each of the photoelectric conversion portions 101 and 102 so as to transfer signal charges in parallel from the separate photoelectric conversion portions, a common detecting unit can be used in a case of serially transferring signal charges from the separate photoelectric conversion portions.

Arraying multiple light receiving elements 1 at the light receiving region 21 of the photoelectric conversion apparatus 10 illustrated in FIG. 1A enables focus detection to be performed within the imaging region by phase difference detection. This can further be applied to an imaging system (camera) which performs distance measurement using phase difference detection. Imaging can also be performed using the signals of the multiple photoelectric conversion portions 101 and 102 output from the light receiving element 1 as imaging signals. For example, the signals of the photoelectric conversion portions 101 and 102 may be combined to be used as imaging signals. Thus, the photoelectric conversion apparatus 10 according to the present embodiment can realize autofocusing (AF) using field phase difference.

An insulating film 110 is disposed upon the substrate 100. Typically, the insulating film 110 is transparent. The insulating film 110 may be a single-layer film formed of one type of material, but typically the insulating film 110 is a multi-layer film where multiple layers of different materials have been layered. One layer of the insulating film 110 is formed of silicon oxide (SiO2). Also, one layer may be a silicate glass such as borophosphosilicate glass (BPSG), phosphosilicate glass (PSG), borosilicate glass (BSG), or the like. Also, one layer of the multiple layer film making up the insulating film 110 may be silicon nitride (Si3N4) or silicon carbide (SiC). Wiring 120 may be provided within the insulating film 110. The wiring 120 may be multi-layer wiring where multiple wiring layers are connected via plugs. While an example is illustrated in FIG. 1B where the wiring 120 is two layers, multilayer wiring of three or more layers may be used. Conductive materials such as copper, aluminum, tungsten, tantalum, titanium, polysilicon, or the like, may be used for the wiring 120. A typical wiring 120 is transparent, and has metallic luster.

The light receiving element 1 has at least one light guide portion 111, with a single light guide portion 111 being formed extending over multiple photoelectric conversion portions 101 and 102. The light guide portion 111 functions to confine incident light to the light guide portion 111, so as to be propagated to the photoelectric conversion portions 101 and 102. The light guide portion 111 has a cross-sectional shape where the maximum width in the X direction in which the photoelectric conversion portions 101 and 102 are arrayed is larger than the maximum width in the Y direction, which is orthogonal to the X direction, which will be described in detail later.

The light guide portion 111 is surrounded by the insulating film 110. That is to say, the insulating film 110 is situated at the perimeter of the light guide portion 111 in the X-Y plane. By making the refractive index of the light guide portion 111 and the refractive index of the insulating film 110 to be different, incident light to the light guide portion 111 can be guided to the photoelectric conversion portions 101 and 102 due to reflection at the interface of the light guide portion 111 and the insulating film 110. Making the refractive index of the light guide portion 111 to be higher than the refractive index of the insulating film 110 enables total reflection, so reflection efficiency can be improved.

Surrounding the light guide portion 111 by a low-refractive index region (e.g., an air gap) having a lower refractive index than the light guide portion 111 and the insulating film 110 enables incident light to the light guide portion 111 to be guided to the photoelectric conversion portions 101 and 102 by total reflection at the interface of the light guide portion 111 and the low-refractive index region. Also, surrounding the side face of the light guide portion 111 by a reflective member such as metal or the like enables incident light to the light guide portion 111 to be guided to the photoelectric conversion portions 101 and 102 by metallic reflection. In a case of providing the low-refractive index region, or the reflective member, the refractive index of the light guide portion 111 may be different from the refractive index of the insulating film 110, or may be the same.

The material of the light guide portion 111 may be an organic material (resin), or may be an inorganic material. Examples of resin include siloxane resins, polyimide resins, and so forth. Suitable examples of inorganic materials include silicon nitride (SixNy), silicon oxynitride (SixOyNz), and titanium oxide ($TiO_2$). The light guide portion 111 may be configured using a single material, or may be configured using multiple materials.

General values for the refractive index for the materials exemplified for the light guide portion 111 and insulating film 110 will be listed here. The refractive index for silicon oxide is 1.4 to 1.5, for silicon oxynitride is 1.6 to 1.9, for silicon nitride is 1.8 to 2.3, for titanium oxide is 2.5 to 2.7, and for BSG, PSG, and BPSG is 1.4 to 1.6. The above-described values are only exemplary, and by changing the film forming method, the same material will have different non-stoichiometric compositions and different material densities, so the refractive index can be set as suitable. Note that the refractive index of resin generally is 1.3 to 1.6, and even is high-refractive-index resins 1.6 to 1.8. However, inclusion of high-refractive index inorganic material such as metal oxides or the like enables the effective refractive index to be raised. Examples of high-refractive index inorganic materials to be included in the resin include titanium oxide, tantalum oxide, niobium oxide, tungsten oxide, zirconium oxide, zinc oxide, indium oxide, hafnium oxide, and so forth.

Although another configuration of the light receiving element 1 will be described, the configuration of the light receiving element 1 can be changed as suitable. A high-refractive-index film 113 is disposed covering the light guide portion 111 and the insulating film 110. The high-refractive-index film 113 has a higher refractive index than the refractive index of the insulating film 110. The high-refractive-index film 113 may be formed of the same material as the light guide portion 111. In this case, the interface of the high-refractive-index film 113 and the light guide portion 111 can be deemed to be situated at the same height as the upper face of the insulating film 110.

A low-refractive-index film 114 is disposed above the high-refractive-index film 113 and an in-layer lens 115 is disposed across the low-refractive-index film 114 from the high-refractive-index film 113. The low-refractive-index film 114 has a lower refractive index than the refractive index of at least one of the in-layer lens 115 and the high-refractive-index film 113 (or the light guide portion 111). The low-refractive-index film 114 can have at least one of a function of adjusting the distance between the in-layer lens 115 and the light guide portion 111, a planarizing function, and a condensing function due to refraction of light. A wavelength selecting portion 117 is disposed across a planarizing film 116 from the in-layer lens 115. The wavelength selecting portion 117 is a color filter, dichroic mirror, or the like, with each light receiving element 1 of the light receiving region 21 having different wavelength transmission properties according to a Bayer array or the like. A light condensing portion 118 is formed as a microlens upon the wavelength selecting portion 117. A singular light guide portion 111, a singular in-layer lens 115, a singular wavelength selecting portion 117, and a singular light condensing portion 118 is provided for, and corresponds to the multiple photoelectric conversion portions 101 and 102.

Note that in the following description, "the refractive index of the insulating film 110" will be described as the refractive index of a material making a greater part of the insulating film 110. Also, "the refractive index of the light guide portion 111" will be described as the refractive index of a material making a greater part of the light guide portion 111. The refractive index of the light guide portion 111 is larger than the refractive index of the insulating film 110. The term "refractive index" as such in the present invention means absolute refractive index. While the refractive index changes depending on the wavelength, the refractive index is at least that regarding a wavelength of light which can generate a signal charge at the photoelectric conversion portion 101. Typically, the reference preferably is a wavelength of light regarding which most photoelectric conversion is performed at the photoelectric conversion portions. In a case where the photoelectric conversion apparatus 10 has a wavelength selecting portion such as a color filter or the like, the wavelength of light which has transmitted the wavelength selecting portion, and in particular the primary transmitting wavelength, is preferably used. The selectivity of the wavelength selecting portion may be imperfect. That is to say, the transmissivity of a wavelength selected by the wavelength selecting portion may be less than 100%, and the transmissivity of wavelengths not selected at the wavelength selecting portion does not have to be 0%.

The form of the light guide portion 111 will be described in detail with reference to FIG. 2A. In FIG. 2A, the drawing indicated by [XZ] is a cross-sectional view of a light receiving element 1 at the X-Z plane, and the drawing indicated by [YZ] is a cross-sectional view of the light receiving element 1 at the Y-Z plane. The drawing indicated by [XY1] is a cross-sectional view of the light receiving element 1 at the X-Y plane at the height of Z1 in the Z (height) direction, and the drawing indicated by [XY3] is a cross-sectional view of the light receiving element 1 at the X-Y plane at the height of Z3 in the Z (height) direction. Note that the cross-sectional views at [XY1] and [XY3] in the X-Y plane have been situated on the light guide portion 111 upon the photoelectric conversion portions 101 and 102 and the isolation portion 109, for sake of convenience. The X direction is the direction in which the multiple photoelectric conversion portions 101 and 102 are arrayed, as described earlier. The position Z2 is a position halfway along the length of the light guide portion 111 in the Z direction for example, and the position Z2 is a position between a first wiring layer and a second wiring layer, for example. The position Z1 is farther away from the substrate 100 than the position Z2, and the position Z3 is closer to the substrate 100 than the position Z2.

The light guide portion 111 according to the present embodiment has a cross-sectional shape at a plane parallel to the substrate 100 (X-Y plane) where the greatest width in the X direction and the greatest width in the Y direction are different. A plane (X-Y plane) parallel to the substrate 100 taken to evaluate the cross-sectional shape of the light guide portion 111 may be a plane taken at any position (height) in the Z direction, as long as a plane traversing the light guide portion 111. Of the three X-Y planes traversing the light guide portion 111, the position of the X-Y plane which is farther from the substrate 100 than the position Z2 and situated at the side where light is input, is Z1, and the position of the X-Y plane which is nearer to the substrate 100 than the position Z2 and situated at the side where light is output, is Z3.

Figure 10:
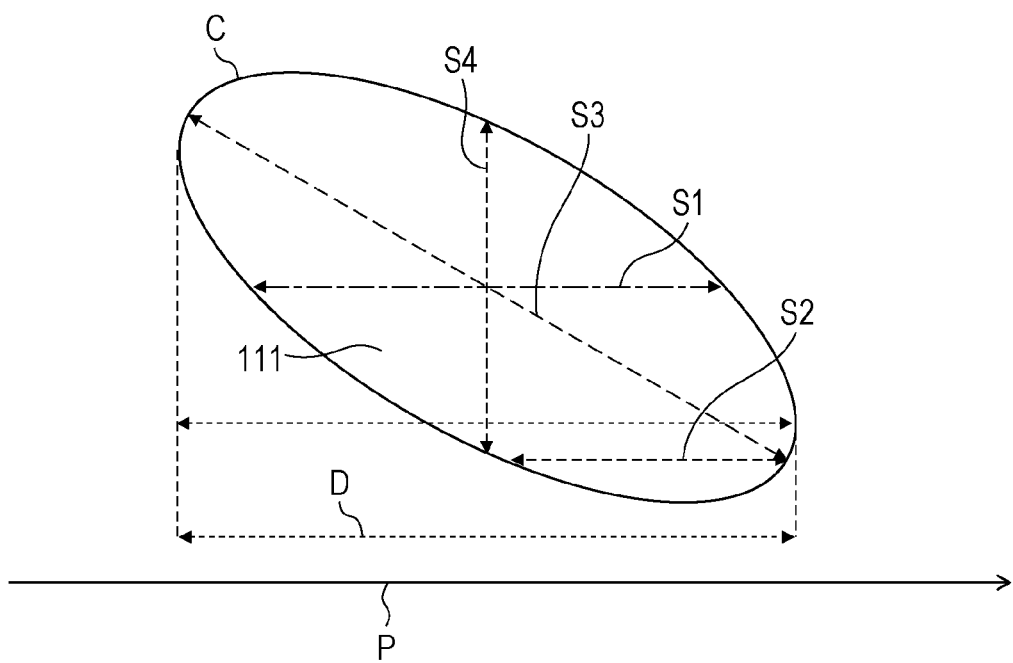
FIG. 10 is a schematic diagram for describing maximum width.

The "greatest width" of the light guide portion 111 in a certain direction will be described with reference to FIG. 10. The "greatest width" of the light guide portion 111 in a certain direction is the greatest value (upper limit) of the length of line segments which are parallel to each other in a predetermined direction, and of which both of one end and the other end (both ends) are situated on the perimeter of the light guide portion 111. FIG. 10 illustrates a predetermined direction orthogonal to the Z direction at a certain height in the Z direction by an arrow P, and the perimeter of the light guide portion 111 by a solid line C. Four line segments S1, S2, S3, and S4 are illustrated representatively as line segments of which one end and the other end are situated on the perimeter of the light guide portion 111. The line segment S1 is the line segment which has the greatest length of the line segments which are parallel to the certain direction P and of which one end and the other end are situated on the perimeter of the light guide portion 111. Accordingly, the greatest width of the light guide portion 111 in the certain direction P is represented by the length of S1. The line segment S2 is not the line segment which has the greatest length of the line segments of which one end and the other end are situated on the perimeter of the light guide portion 111, and accordingly does not correspond to the greatest width of the light guide portion 111 in the certain direction. The line segment S3 is a line segment which has the greatest length of the line segments of which one end and the other end are situated on the perimeter of the light guide portion 111, but is not parallel to the certain direction P, and accordingly does not correspond to the greatest width of the light guide portion 111 in the certain direction P. The length D is not the length of a line segment of which one end and the other end are situated on the perimeter of the light guide portion 111, and accordingly does not correspond to the greatest width of the light guide portion 111 in the certain direction P. Along the same line of thought, the length of the line segment S4, which is orthogonal to the line segment S1, and has the greatest length of the line segments of which both ends are situated on the perimeter C, corresponds to the greatest width of the light guide portion 111 in the direction orthogonal to the certain direction P.

The greatest width of the light guide portion 111 in the X direction in FIG. 2A is WX1 at position Z1, is WX2 at position Z2, and is WX3 at position Z3. The greatest width of the light guide portion 111 in the Y direction is WY1 at position Z1, is WY2 at position Z2, and is WY3 at position Z3. The light guide portion 111 has a cross-sectional shape such that greatest width on a plane parallel to the substrate 100 (X-Y plane) in the X direction is greater than the greatest width in the Y direction. For example, at position Z1 the greatest width WX1 is greater than the greatest width WY1 (WX1>WY1). In the same way, at position Z2 the greatest width WX2 is greater than the greatest width WY2 (WX2>WY2), and at position Z3 the greatest width WX3 is greater than the greatest width WY3 (WX3>WY3).

The cross-sectional shape of the light guide portion 111 on an X-Y plane may differ depending on the distance from the substrate 100. The light guide portion 111 according to this example has a cross-sectional shape where the greatest width in the X direction and the greatest width in the Y direction are different at a plane parallel to the substrate 100 (X-Y plane). For example, with regard to the greatest width of the light guide portion 111 in the X direction, and the greatest width WX3 at position Z3 is smaller than the greatest width WX2 at position Z2 (WX2>WX3), and the greatest width WX1 at position Z1 is greater than the greatest width WX2 at position Z2 (WX1>WX2). Also, with regard to the greatest width of the light guide portion 111 in the Y direction, the greatest width WY1 at position Z1 is larger than the greatest width WY2 at position Z2 (WY1>WY2), and the greatest width WY3 at position Z3 is greater than the greatest width WY2 at position Z2 (WY2>WY3). The greatest widths can be said to differ if the greatest width of the light guide portion 111 in the X direction is larger than the greatest width of the light guide portion 111 in the Y direction by ±1% at a certain position in the Z direction. In order to obtain sufficient advantages, the greatest width of the light guide portion in the X direction 111 is preferably 1.05 times or more the greatest width of the light guide portion 111 in the Y direction, at each position in the Z direction, and more preferably is 1.10 times or more. The greatest width of the light guide portion 111 in the X direction 111 may be 1.50 times or less the greatest width of the light guide portion 111 in the Y direction at each position in the Z direction, and may be 1.20 times of less.

As can be understood from the comparison of [XY1] and [XY2], and [XZ] and [YZ], in FIG. 2A, the cross-sectional area of the X-Y plane of the light guide portion 111 gradually becomes smaller toward the photoelectric conversion portions 101 and 102 away from the direction of light input. That is to say, the light guide portion 111 is tapered toward the substrate 100. Also, at each cross-section of the light guide portion 111 at position Z1, position Z2, and position Z3, the greatest widths WX1, WX2, and WX3 in the X direction are each greater than the greatest widths WY1, WY2, and WY3 in the Y direction, in this shape.

For example, at position Z1, the greatest width WX1 of the light guide portion 111 in the X direction is around 0.30 μm to 10 μm, and the greatest width WY1 of the light guide portion 111 in the Y direction is around 0.25 to 9 μm. The greatest width WX3 of the light guide portion 111 in the X direction at position Z3 is around 0.25 μm to 9 μm, and the greatest width WY3 of the light guide portion 111 in the Y direction is around 0.20 μm to 8 μm. A value between the greatest width at position Z1 and the greatest width at position Z3 can be taken for the position Z2.

The refractive index of the light guide portion 111 to a wavelength λ of light subjected to photoelectric conversion at the photoelectric conversion portions 101 and 102 will be represented by $n_1$, and a refractive index of the insulating film 110 which is the member situated at the perimeter of the light guide portion 111 will be represented by $n_0$. The effective refractive index of the waveguide structure where the light guide portion 111 is the core and the insulating film 110 is the cladding will be represented by $n_e$. Note that the effective refractive index $n_e$ is as expressed in Expression (1), and is 0.5 to 1.5 in a general waveguide structure.

$$n_e = \sqrt{n_1^2 - n_0^2} \quad (1)$$

The greatest widths WY1, WY2, and WY3 in the Y direction at the positions Z1, Z2, and Z3 of the light guide portion 111 are preferably $3 \times \lambda/n_e$ or less, and more preferably $2 \times \lambda/n_e$ or less. In particular, the greatest width in the Y direction, WY, of the light guide portion 111 is preferably $3 \times \lambda/n_e$ or less, and more preferably $2 \times \lambda/n_e$ or less. greatest width WY is normally realized to the upper face of the light guide portion 111 in the Y direction. Restricting the greatest width of the light guide portion 111 in the Y direction to the above range restricts the number of waveguide modes in the Y direction, which is effective in restricting light from spreading in the Y direction within the light guide portion 111. If the greatest width of the light guide portion 111 in the Y direction is set to 800 nm or less, $3\times\lambda/n_e$ or less can be realized for almost all wavelengths of visible light (400 to 800) in all practicality. The reason is that $3\times\lambda/n_e$ or less is realized even when the effective refractive index $n_e$ is extremely low, at 0.5, or even when the effective refractive index $n_e$ is extremely high, at 1.5.

FIGS. 2A and 2B illustrate a middle portion 119 which overlaps the isolation portion 109 in the Z direction of the light guide portion 111. The length (width) of the middle portion 119 in the Y direction in a plane at a certain position in the Z direction is preferably smaller than the greatest width of the light guide portion 111 in the X direction. The width of the middle portion 119 in the Y direction is a crucial factor when deciding which of the multiple photoelectric conversion portions 101 and 102 to divide the incident light to the light guide portion 111 to. Sufficiently reducing the width of the middle portion 119 in the Y direction is effective in improving the precision of dividing the light.

Also, the greatest width WX3 at the position Z3 of the light guide portion 111 on the X direction is arranged to be shorter than the sum of greatest widths of the two arrayed photoelectric conversion portions 101 and 102 In the X direction. Thus, incident light to the light guide portion 111 can be input to the photoelectric conversion portion 101 or photoelectric conversion portion 102 with little loss.

FIG. 2B illustrates the way that light L input to the light guide portion 111 at an oblique angle (arrow) in the form in FIG. 2A propagates through the light guide portion 111. [XZ] and [YZ] in FIG. 2B illustrate electric field intensity distribution at the positions Z1, Z2, and Z3, by doted lines. [XY1] and [XY3] in FIG. 2B illustrate contours of electric field intensity at positions Z1 and Z3. The waveguide structure serving as a model for the electric field intensity distribution in FIG. 2B has the refractive index of the light guide portion 111 set to 1.82, the refractive index of the insulating film 110 set to 1.46, the greatest width in the Y direction at Z1 set to 1.0 µm, and the greatest width in the X direction set to 1.6 µm. Also, the greatest width in the Y direction at Z3 is set to 0.95 µm, and the greatest width in the X direction set to 1.55 µm. Note however, that a similar electric field intensity distribution can be obtained unrestricted by these conditions, by satisfying the relationship between the greatest widths of the X direction and Y direction described above.

In wave optics, incident light to the light guide portion 111 propagates in the form of waves, so an electric field intensity distribution occurs in the light guide portion 111. Places where the electric field intensity is strong represent places where the probability is high that there is a great amount of light. At this time, the shape of the light propagating through the light guide portion 111 (the shape of the electric field intensity distribution) is dependent on the shape of the light guide portion 111. The wider the greatest width of the light guide portion 111 is, the greater the probability of light existing becomes, so the amount of light propagating in the direction where the greatest width is broader increases. The cross-sections of the light guide portion 111 at Z1, Z2, and Z3 are shapes where the greatest width in the X direction is larger than the greatest width in the Y direction, so the X direction propagates relatively more light that the Y direction.

Accordingly, in a case where incident light L having a vector of a +X component and −Z component is input obliquely as illustrated in FIG. 2B, the light is deviated toward the +X side at the X-Y plane near the position Z1 which is around the entrance of the light guide portion 111. According to wave optics, the light that has been input obliquely couples with odd modes such as primary and ternary, in addition to even modes such as 0-order and secondary, and thus propagates. Here, an odd mode is a waveguide mode having an electric field amplitude described by an odd function with respect to an axis passing through the center of the light guide portion 111, parallel to the Z axis at an X-Z plane. In a case of an even function, this is called an even mode. The larger the greatest width of the light guide portion 111 is, the greater the number of coupling modes is. Accordingly, the incident light having the X-directional component tends to deviate in the X direction. The light which has deviated in the +X direction at the entrance of the light guide portion 111 propagates while remaining deviated to the +X side, and the light thus reaches the substrate 100. Of the two arrayed photoelectric conversion portions 101 and 102 in the X direction in FIG. 2B, the incident light L from the angle of a vector having the +X component and −Z component, for example, is primarily input to the photoelectric conversion portion 102 situated at the +X side. In the same way, in a case of incident light L from the angle of a vector having the −X component and −Z component, which is the opposite from that in FIG. 2A with regard to the X direction, a great amount of the light is input to the photoelectric conversion portion 102. As a result, light can be divided to the two photoelectric conversion portions 101 and 102 with good precision, while maintaining sensitivity.

The X-Y plane cross-sectional area of the light guide portion 111 according to the present example has a shape which gradually grows smaller as the light propagates. At the position Z1 where light L is input to the light guide portion 111, the cross-sectional area is configured larger than at the position Z2, whereby a greater amount of light L can be input to the light guide portion 111. At the position Z3 where light L is output from the light guide portion 111, the cross-sectional area is configured smaller than at the position Z2, whereby loss of light L due to transfer gates and transistors and the like formed on the surface of the substrate 100 can be reduced. Accordingly, light can be divided to the two photoelectric conversion portions 101 and 102 in a precise manner, while further improving sensitivity.

Now, in the present embodiment, the light guide portion 111 extends over the multiple photoelectric conversion portions 101 and 102, so dividing precision of the light can be improved while maintaining sufficient sensitivity. Conversely, in a case where multiple light guide portions are to be provided, each corresponding only to respective ones of the multiple light guide portions, the following problems occur. One is that loss occurs due to reflection among the multiple light guide portions. Another is that dividing of the photoelectric conversion portions receiving light is dominated by the incident position of the light, and not the incident angle. This means that the correlation between the photoelectric conversion portions receiving light and the incident angle of the light deteriorates, which is disadvantageous in improving precision of focus detection.

An example of the light guide portion 111 has been described in FIGS. 2A and 2B where the greatest width in the X direction is larger than the greatest width in the Y direction at any height in the Z direction. However, it is sufficient that the light guide portion 111 have a greatest width in the X direction larger than the greatest width in the Y direction in part of the height in the Z direction. Conversely, a light guide portion 111 can be employed where the greatest width in the X direction is equal to or smaller than the greatest width in the Y direction in at least a part of the Z direction. FIGS. 3A and 3B illustrate the same items as in FIGS. 2B and 2B, other than the cross-sections at the X-Z plane, Y-Z plane, and X-Y plane of the light guide portion 111 differ from those in FIGS. 2B and 2B. [XY1] and [XY3] in FIGS. 3A and 3B illustrate electric field intensity distributions in a manner equivalent to those illustrated in FIG. 2B. FIG. 3A illustrates equivalent features to those of FIG. 2B, other than the cross-sections at the X-Z plane, Y-Z plane, and X-Y plane of the light guide portion 111, and the electric field intensity distribution, differ from those in FIG. 2B.

In FIG. 3A, WX1=WY1, WX2>WY2, and WX3>WY3 hold. Also, WX1>WX2>WX3, and WY1>WY2>WY3 hold. For example, WX1 and WY1 are set to 1.6 µm, WX3 to 1.55 µm, and WY3 to 0.95 µm.

In FIG. 3A, the light L input to the position Z1 is deviated in the X direction and Y direction. As the light L propagates from Z1 toward Z2, and from Z2 toward Z3, the amount of deviation of the light in the Y direction decreases, and the deviation in the X direction becomes marked. Accordingly, the great part of the light L is received at the photoelectric conversion portion 102. In the same way, light input from the opposite direction from the light L is received at the photoelectric conversion portion 101. Thus, the precision of dividing light can be improved.

In FIG. 3B, WX1>WY1, WX2>WY2, and WX3=WY3 hold. Also, WX1>WX2>WX3, and WY1>WY2>WY3 hold. For example, WX1 is set to 1.5 µm, WY1 to 1.0 µm, and WX3 and WY3 to 0.95 µm.

In the form in FIG. 3B, the light L input to the position Z1, which is around the entrance of the light guide portion 111, is deviated in the X direction. As the light L propagates from Z1 toward Z2, and from Z2 toward Z3, the amount of deviation of the light in the X direction decreases. According to wave optics, the light that has been input obliquely couples with many odd modes such as primary and ternary, in addition to even modes such as 0-order and secondary, at the position Z1, and thus becomes light deviated in the X direction. The odd modes propagate through the light guide portion 111 as odd modes without change. Accordingly, even if the greatest width of the light guide portion 111 to position Z3 is the same in the X direction and the Y direction, the light is deviated in the X direction at position Z3. Accordingly, the most significant part of the light L is received at the photoelectric conversion portion 102. In the same way, light input from the opposite direction from the light L is received at the photoelectric conversion portion 101. Thus, the precision of dividing light can be improved.

Figure 4:
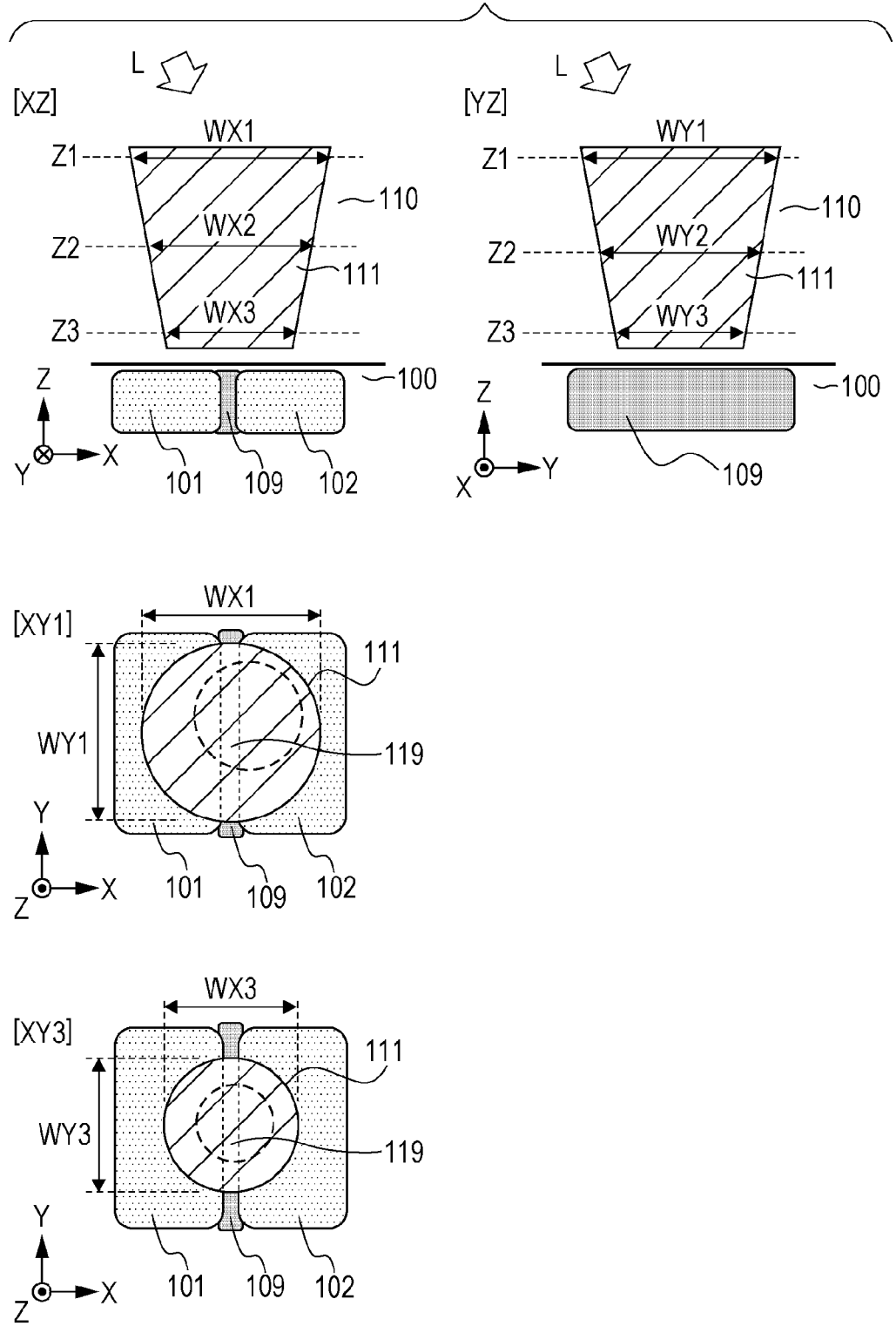
FIG. 4 is a schematic diagram exemplarily illustrating light receiving elements.

A case where the cross-section has the same greatest width in the X direction and Y direction at any portion of the light guide portion 111 in the Z direction is illustrated in FIG. 4, for comparison. In the case in FIG. 4, WX1=WY1, WX2=WY2, and WX3=WY3 hold. In this case, the light propagating through the light guide portion 111 tends to spread in the Y direction, and deviation in the X direction is smaller. Accordingly, the amount of light input near the isolation portion 109 of the photoelectric conversion portions 101 and 102 arrayed in the X direction increases, and light L cannot be divided in a precise manner. It can be understood from the form in FIG. 4 that the deviation of the dotted line representing the contour of electric field intensity at [YX3] is smaller than the deviation at [XY1].

For example, light L input from an angle having a vector with +X component and −Z component is input to the photoelectric conversion portion 101 and photoelectric conversion portion 102 with scant difference. Accordingly, suitable dividing of the light L to the photoelectric conversion portion 101 and photoelectric conversion portion 102 thus cannot be performed.

Other shapes can be applied to the cross-sectional shape of the light guide portion 111 to the X-Y plane in the present embodiment without departing from the underlying inventive concept, unrestricted to the shape where the four corners of a rectangle have been rounded such as illustrated in FIG. 3A.

The cross-sectional area of the X-Y plane of the light guide portion 111 is a shape which gradually increases in the +Z direction. Thus, light collection efficiency can be improved, while avoiding reflection of light and so forth at the wiring 120 and gate electrodes 103 and 104 (see FIG. 1C). Note however, that the shape may become smaller in the +Z direction, or a shape may be used where the cross-sectional area of the Y-Y plane does not change in the Z direction. Light can be divided to the two photoelectric conversion portions with good precision as long as the greatest width in the X direction of the light guide portion 111 is larger than the greatest width in the Y direction at a given plane (X-Y plane) parallel to the substrate 100. The present example also has a configuration where the size of the cross-section of the light guide portion 111 gradually and continuously changes. This enables the loss of light within the light guide portion 111 to be reduced. However, a shape may be used where the size of the cross-section changes non-continuously and abruptly at a certain height.

Figure 5:
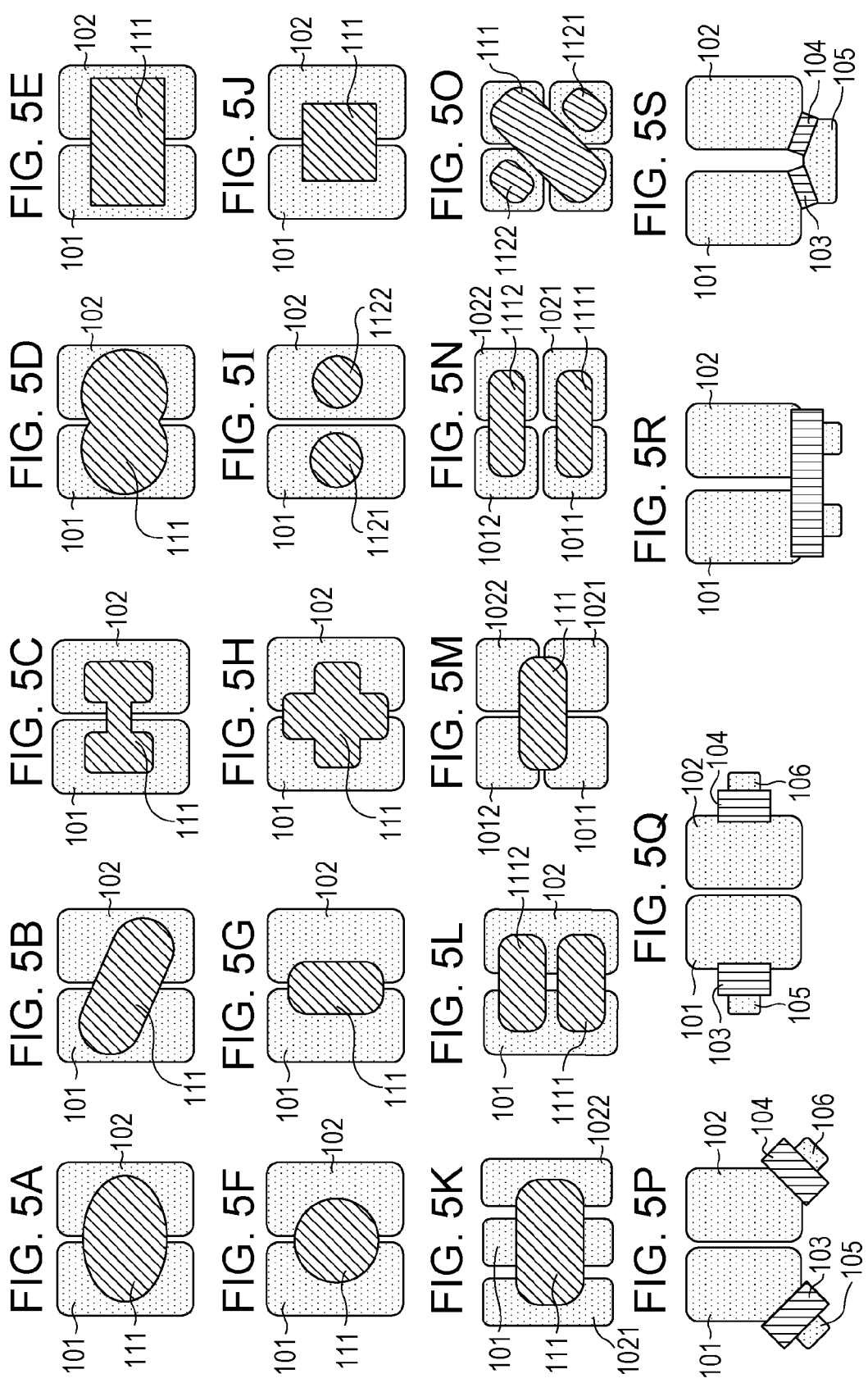
FIGS. 5A-5S are schematic diagrams exemplarily illustrating light receiving elements.

FIGS. 5A through 5O illustrate examples of the cross-sectional shape of the light guide portion 111 on the X-Y plane at Z1 and/or Z3. As illustrated in FIG. 5A, the cross-sectional shape of the light guide portion 111 may be an ellipse. As illustrated in FIG. 5B, the longitudinal direction of the cross-sectional shape of the light guide portion 111 may be included on the direction where the multiple photoelectric conversion portions are arrayed (X direction). As illustrated in FIG. 5C, the portion of the light guide portion 111 that is not above the isolation portion 109 but situated above the photoelectric conversion portions 101 and 102 may have a shape such that the greatest width in the Y direction is greater than the greatest width in the X direction. As illustrated in FIG. 5D, the light guide portion 111 may have a shape where multiple light guide portions have been combined. As illustrated in FIG. 5E, the cross-sectional shape of the light guide portion 111 may be a polygon. For example, an arrangement may be made where the shape is that illustrated in FIG. 5A on the X-Y plane at Z1 where light is input, and the shape is that illustrated in FIG. 5D on the X-Y plane at Z3 at the substrate 100 side.

As illustrated in FIGS. 5F through 5J, the light guide portion 111 may have a cross-sectional shape such that the greatest width in the cross-sectional Y direction on the X-Y plane is greater than the greatest width in the X direction at a certain position in the Z direction. Specifically, as illustrated in FIG. 5F, the cross-sectional shape of the light guide portion 111 may be a circle. As illustrated in FIG. 5G, the cross-sectional shape of the light guide portion 111 may be a quadrangle with rounded corners, where the greatest width in the Y direction is greater than in the X direction. As illustrated in FIG. 5H, the cross-sectional shape of the light guide portion 111 may be a cross. As illustrated in FIG. 5I, multiple light guide portions 1121 and 1122 may be provided which do not extend over the multiple photoelectric conversion portions 101 and 102. For example, the cross-section may be such as that in FIG. 5D at a certain position in the Z direction, and a cross-section such as that in FIG. 5I at a different position. As illustrated in FIG. 5J, the cross-sectional shape of the light guide portion 111 may be a square. For example, the cross-section may be such as that in FIG. 5E at a certain position in the Z direction, and a cross-section such as that in FIG. 5F at a different position. In this case, the greatest width in the Y direction may be constant regardless of the height in the Z direction, as shown in FIGS. 5E and 5F.

As illustrated in FIG. 5K, a single light guide portion 111 may be provided extending over three or more photoelectric conversion portions 101, 1021, and 1022. As illustrated in FIG. 5L, multiple light guide portions 1111 and 1112 each extending over the multiple photoelectric conversion portions 101 and 102 may be provided for one light receiving element 1. As illustrated in FIG. 5M, a single light guide portion 111 may be provided extending over four or more photoelectric conversion portions 1011, 1021, 1012, and 1022. In this case, six combinations of two photoelectric conversion portions selected form the four photoelectric conversion portions are conceivable. However, the relationship where the greatest width of the light guide portion 111 in the direction where the photoelectric conversion portions are arrayed is larger than the greatest width of the light guide portion 111 in the direction orthogonal to the direction where the photoelectric conversion portions are arrayed, does not have to be satisfied for all six combinations.

In a case where one light receiving element 1 has four photoelectric conversion portions, the cross-section of the light guide portion 111 may have a shape where the greatest width in the row direction is larger than the greatest width in the column direction, if placing importance on dividing light to the photoelectric conversion portions arrayed in the row direction. Also, the cross-section of the light guide portion 111 may have a shape where the greatest width in the column direction is larger than the greatest width in the row direction, if placing importance on dividing light to the photoelectric conversion portions arrayed in the column direction.

As illustrated in FIG. 5N, one light receiving element 1 may be provided having a light guide portion 1111 extending over two photoelectric conversion portions 1011 and 1021, and a light guide portion 1112 extending over two photoelectric conversion portions 1012 and 1022. As illustrated in FIG. 5O, a light receiving element 1 has a single light guide portion 111 provided extending over multiple photoelectric conversion portions 1011 and 1021. In addition to this, the light receiving element 1 has a singular light guide portion 1121 disposed only to a singular photoelectric conversion portion 1021, and a singular light guide portion 1122 disposed only to a singular photoelectric conversion portion 1022.

As illustrated in FIG. 5P, the transfer direction from the photoelectric conversion portions 101 and 102 to the detection units 105 and 106 may be non-parallel. As illustrated in FIG. 5Q, the transfer direction from the photoelectric conversion portions 101 and 102 to the detection units 105 and 106 may be opposite to each other. As illustrated in FIG. 5R, a singular transfer gate 103 may be provided in common to the multiple detection units 105 and 106 corresponding to the multiple photoelectric conversion portions 101 and 102. As illustrated in FIG. 5S, a singular detection unit 105 may be provided in common to the multiple transfer gates 103 and 104 corresponding to the multiple photoelectric conversion portions 101 and 102.

Figure 6:
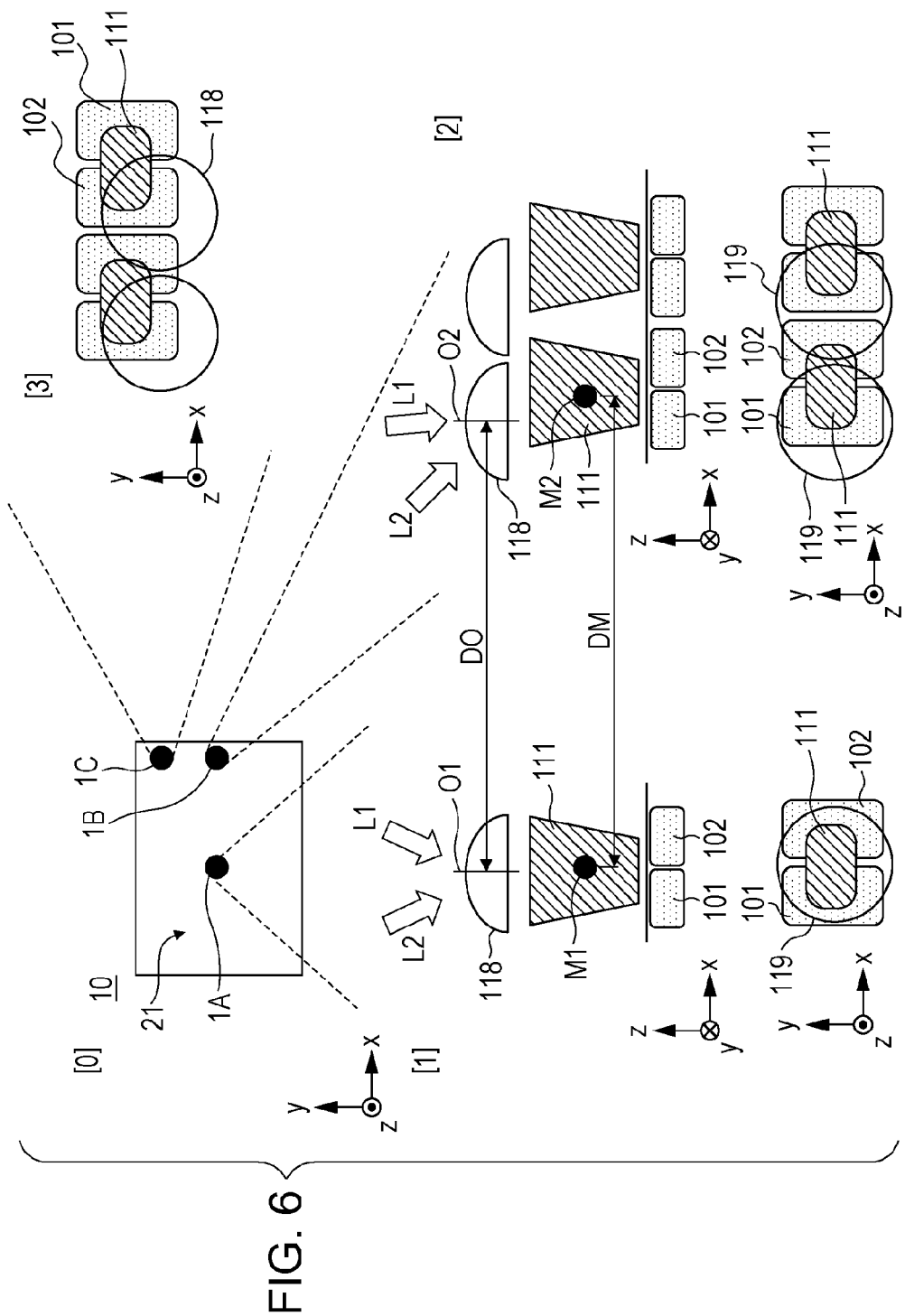
FIG. 6 is a schematic diagram exemplarily illustrating a photoelectric conversion apparatus.

In a case of disposing a light condensing portion 118 over (on the +Z side) of the light guide portion 111 as in the present example, the optical axis of the light condensing portion 118 may be offset as to the isolation portion 109 near the light receiving region of the photoelectric conversion apparatus 10. This example is illustrated in FIG. 6. [0] in FIG. 6 illustrates the light receiving region 21. [1], [2], and [3] in FIG. 6 illustrate the positional relationship between the light condensing portion 118, the light guide portion 111, and the photoelectric conversion portions 101 and 102, at the vertical and horizontal middle of the light receiving region 21, at the vertical middle and at the right edge, and at the edge in the diagonal direction. The angle of incident light L becomes obtuse from around the middle of the photoelectric conversion apparatus 10 toward the perimeter portion. A configuration where placement of the of the light condensing portions 118 is gradually shifted toward the center direction of the photoelectric conversion apparatus 10 enables sensitivity to be improved at all region, from around the middle of the photoelectric conversion apparatus 10 to the perimeter. Also, the light can be divided to each of the two photoelectric conversion portions 101 and 102 with better precision. In a case of a solid-state imaging apparatus having focus detecting capabilities, the focus detecting capabilities can also be improved.

For example, multiple light receiving elements 1 have a first light receiving element 1A situated at the middle portion of the light receiving region 21, and a second light receiving element 1B and third light receiving element 1C situated at the perimeter of the light receiving region 21. In an arrangement where the light receiving region 21 is divided into nine sections of three rows by three columns, the middle portion is the section at the second row and second column, and the remaining eight sections other than the middle portion are the perimeter. The second light receiving element 1B is situated at the second row and third column, for example, and the third light receiving element 1C is situated at the first row and third column, for example. A distance DO between an optical axis O1 of the light condensing portion 118 of the first light receiving element 1A and an optical axis O2 of the light condensing portion 118 of the second light receiving element 1B is smaller than a distance DM between the center of gravity M1 of the light guide portion 111 of the first light receiving element 1A and the center of gravity M2 of the light guide portion 111 of the second light receiving element 1B (DM<DO). This is true between the first light receiving element 1A and the third light receiving element 1C, as well. That is to say, the distance between the optical axis of the light condensing portion 118 of the first light receiving element 1A and an optical axis of the light condensing portion 118 of the third light receiving element 1C is smaller than the distance between the center of gravity M1 of the light guide portion 111 of the first light receiving element 1A and the center of gravity of the light guide portion 111 of the second light receiving element 1B.

While a configuration is illustrated in FIG. 6 where the light condensing portions 118 are shifted toward the middle portion of the photoelectric conversion apparatus 10, a configuration may be made where all are shifted in parallel in the same direction (e.g., the +Y direction). For example, shifting so as to be distanced away from the transfer gates enables the percentage lost at the transfer gates to be reduced, further improving sensitivity. A configuration where not only the light condensing portions 118 but also the light guide portions 111 are shifted can yield similar advantages. Further, a configuration where the photoelectric conversion portions are shifted along with the light guide portions 111 can yield similar advantages.

Figure 7:
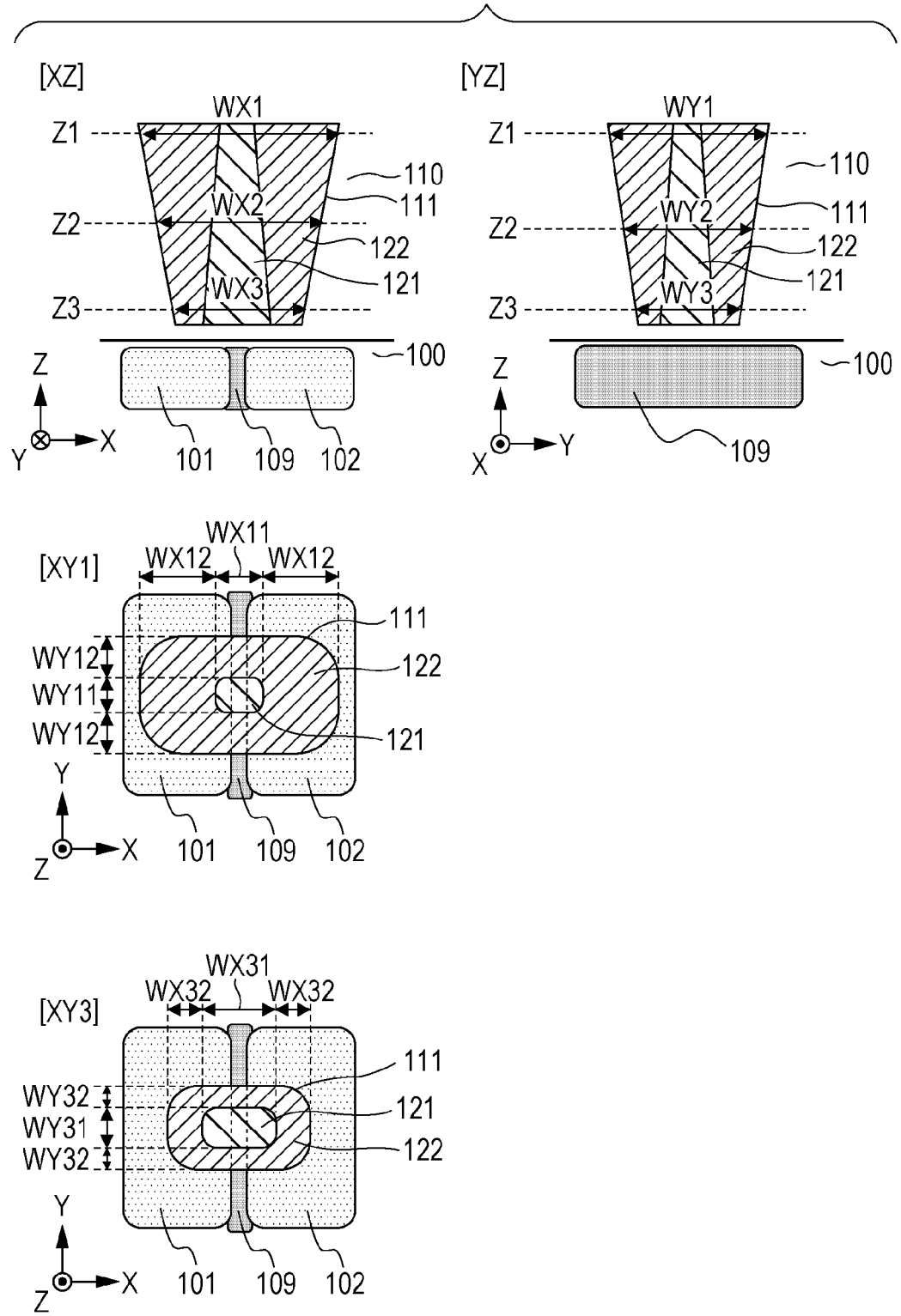
FIG. 7 is a schematic diagram exemplarily illustrating light receiving elements.

The light guide portion 111 may have a refractive index distribution within, as illustrated in FIG. 7. In FIG. 7, the light guide portion 111 includes a first part 121 and a second part 122. The second part 122 is situated on the −X side and +X side of the first part 121 in the X direction. That is to say, the first part 121 is sandwiched by the second part 122 in the X direction. The first part 121 has at least one portion thereof situated above the isolation portion 109, and the second part 122 has at least one portion thereof situated above the photoelectric conversion portions 101 and 102.

The first part 121 and the second part 122 have different refractive indices. The refractive index of the first part 121 may be higher than the refractive index of the second part 122, or the refractive index of the first part 121 may be lower than the refractive index of the second part 122. A boundary between the first part 121 and the second part 122 can be determined by using an average refractive index in the light guide portion 111 as a standard. That is, whether a portion in refractive index 111 belongs to the first portion 121 or the second part 122 is determined based on whether a refractive index of the object portion in refractive index 111 is higher or lower than the average refractive index in the light guide portion 111. In particular, an arrangement where the refractive index of the second part 122 on the outside is higher than the refractive index of the first part 121 at the inner side, can improve the precision of dividing light to the photoelectric conversion portions 101 and 102. From the perspective of wave optics, light conceivably tends to concentrate at a region with a high refractive index. The refractive index at the perimeter of the light guide portion 111 is larger than around the center in this configuration in the X direction. Accordingly, incident light to the light guide portion 111 readily deviates in the X direction. Light which has deviated in the X direction at position Z1 near the entrance of the light guide portion 111 propagates to the position Z3 near the exit of the light guide portion 111, with maintenance of a shape deviated in the X direction. Accordingly, the light is divided to the photoelectric conversion portions 101 and 102 arrayed in the X direction with precision.

At least one of the width of the first part 121 and the width of the second part 122 may differ according to the position in the Z direction. As illustrated in [XY1] in FIG. 7, the width of the first part 121 in the X direction is WX11 at position Z1, and the width of the second part 122 is WX12. Conversely, as illustrated in [XY3] in FIG. 7, the width of the first part 121 in the X direction is WX31 at position Z3, and the width of the second part 122 is WX32. The relationships of WX11<WX31 and WX12>WX32 hold. As illustrated in [XY1] in FIG. 7, the width of the first part 121 in the Y direction is WY11 at position Z1, and the width of the second part 122 is WY12. Conversely, as illustrated in [XY3] in FIG. 7, the width of the first part 121 in the Y direction is WY31 at position Z3, and the width of the second part 122 is WY32. The relationships of WY11<WY31 and WY12>WY32 hold. Note that, the width of the first part 121 in the X or Y direction is defined as a width of a portion whose refractive index is essentially equivalent and continuous. Since the second part 122 are arranged separately (discontinuously) in the X or Y direction with an interposition of the first part 121 therebetween, the width of the light guide portion 111 can be expressed by WX11+(WX12*2) in the X direction and WY11+(WY12*2) in the Y direction. In the example in FIG. 7, the width of the first part 121 continuously increases toward the photoelectric conversion portions 101 and 102 in both the X direction and the Y direction. Also, the width of the second part 122 continuously decreases toward the photoelectric conversion portions 101 and 102. However, the width of the first part 121 and second part 122 may change in stages.

The first part 121 and the second part 122 may be configured using materials with different stoichiometric compositions, or may be configured using materials with the same stoichiometric composition. The material of the light guide portion 111 may be an organic material (resin), or may be an inorganic material. Examples of resin include siloxane resins, polyimide resins, and so forth. Suitable examples of inorganic materials include silicon nitride (Si3N4), silicon oxynitride (SiOXNY), and titanium oxide (TiO2). For example, an arrangement may be made where the first part 121 is configured using resin, and the second part 122 is configured using silicon nitride. Also, an arrangement may be made where the first part 121 is configured using low-density silicon nitride, and second part 122 is configured using high-density silicon nitride.

Note that the term "materials with the same stoichiometric composition" includes materials where there is deviation from the stoichiometric composition, and materials which differ in crystallinity, material concentration, concentration of additive (less than the primary material), and different impurities (1 wt % or less) and the concentration thereof. For example, the stoichiometric composition of silicon nitride is 3 parts Is to 4 parts N, but materials where the actual ratio of Si and N differ from each other within a range where the stoichiometric composition is the same, is deemed to be the same material. Also, monocrystal silicon and polysilicon are deemed as being the same material, for example. Note that materials with difference stoichiometric compositions are not the same material. For example, titanium monoxide (TiO) and titanium dioxide (TiO2) are both compounds of oxygen and titanium (titanium oxides), but stoichiometrically are different materials.

There are cases where the boundary between the first part 121 and the second part 122 can be clearly observed in the refractive index distribution, but there are also cases where this cannot be clearly observed. For example, in a case where the refractive index is gradually changing from the center axis of the light guide portion 111 toward the insulating film 110, there is a likelihood that the boundary between the first part 121 and the second part 122 cannot be clearly observed. In such a case, the boundary between the first part 121 and the second part 122 can be decided as follows. That is to say, the median between the highest value and lowest value of the refractive indices in the light guide portion 111 (highest value+lowest value/2) is obtained. A line connecting points at this median value in the refractive index distribution in the light guide portion 111 can be decided as the boundary between the first part 121 and the second part 122. Also, this median value can be deemed to be the refractive index of the light guide portion 111. In a case where the refractive index of the second part 122 is higher than the refractive index of the first part 121, the first part 121 includes the portion where the refractive index is the smallest, and the second part 122 includes the portion where the refractive index is the greatest.

Examples of the refractive index distribution which the light guide portion 111 has will be illustrated with reference to FIGS. 8A through 8J. While the first part 121 will be described as a low-refractive-index part and the second part 122 as a high-refractive-index part, the high-low relationship of the refractive indices may be opposite. In the form in FIG. 8A, the second part 122 is situated between the first part 121 and the photoelectric conversion portions 101 and 102 at the bottom in the Z direction, with the lower face of the light guide portion 111 (the light emitting face) being configured completely by the second part 122. In the form in FIG. 8B, the second part 122 does not reach to the lower end of the light guide portion 111, and the lower face of the light guide portion 111 is configured completely by the first part 121. In the form in FIG. 8C, the width of the first part 121 is reduced the closer to the photoelectric conversion portions 101 and 102. Also, the width of the second part 122 is constant. In the form in FIG. 8D, the width of the second part 122 increases the closer to the photoelectric conversion portions 101 and 102. In the form in FIG. 8E, the first part 121 is situated between the second part 122 and the photoelectric conversion portions 101 and 102 at the top in the Z direction, with the upper face of the light guide portion 111 (light input face) being configured completely by the second part 122.

As shown in FIG. 8F, the width of the first part 121 may be larger in the Y direction than in the X direction, or as shown in FIG. 8G, the width of the first part 121 may be the same in the X direction and Y direction. As shown in the form in FIG. 8H, the light guide portion 111 may have multiple first portions 121 serving as low-refractive-index parts separated from each other through the second part 122 serving as a high-refractive index part. The first part 121 is not restricted to being surrounded by the second part 122, and may be sandwiched only in the X direction as in the form shown in FIG. 8I, or may be sandwiched only in the Y direction as in the form shown in FIG. 8J.

Figure 9A:
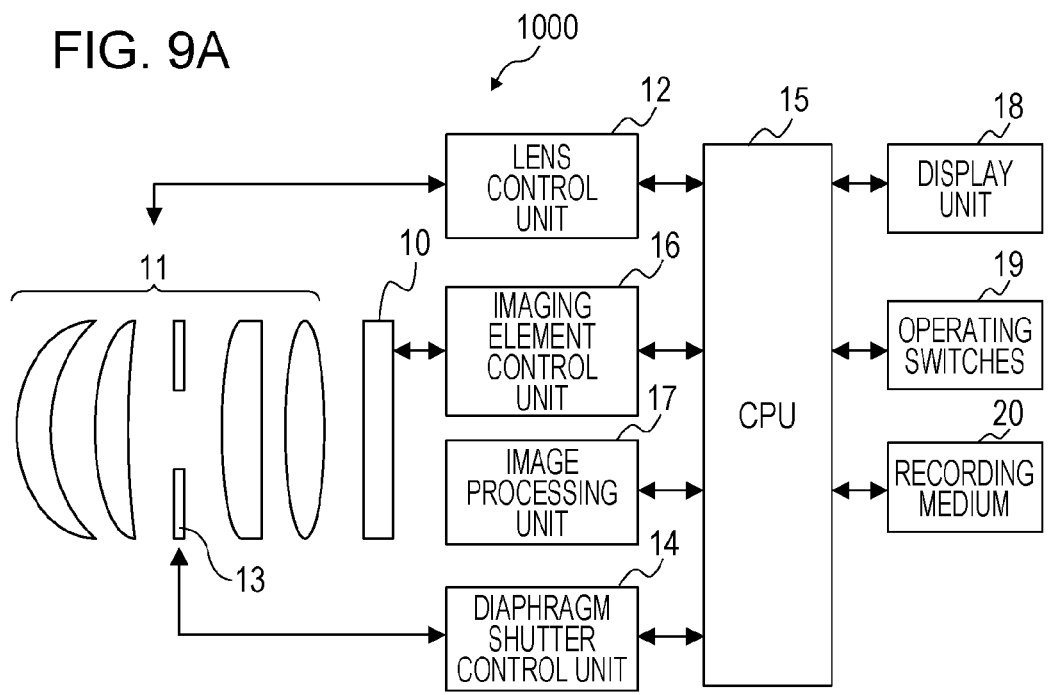
FIGS. 9A-9B are schematic diagrams exemplarily illustrating an imaging system.

FIG. 9A illustrates the configuration of an imaging system 1000 such as a digital still camera, video camera, information terminal having imaging functions, or the like. The imaging system 1000 is mounted with an imaging lens serving as an imaging optical system 11 to image subject images. The focus position of this imaging optical system 11 including the imaging lens is controlled by a lens control unit 12. A diaphragm shutter 13 is connected to a diaphragm shutter control unit 14, having a diaphragm function to perform light quantity adjustment by changing the aperture diameter (variable aperture values), and a shutter function to control exposure time by performing open/close operations when performing still photography. The image space of the imaging optical system 11 includes the imaging surface of the photoelectric conversion apparatus 10 which performs photoelectric conversion of the subject image that has been focused by the imaging optical system 11. The photoelectric conversion apparatus 10 has m light receiving elements each having one or multiple photoelectric conversion portions, arrayed in the horizontal direction, and n arrayed in the vertical direction. A primary color mosaic filter having a Bayer array is disposed to these solid-state imaging elements, thereby making up a two-dimensional single-panel color sensor.

The controller 15 is a camera central processing unit (CPU), governing control of the various actions of the camera. The camera CPU has a computing unit, read-only memory (ROM), random access memory (RAM), an A/D converter, and D/A converter, and a communication interface circuit and the like. The camera CPU controls the actions of the parts of the camera following a computer program stored in the ROM, and executes a series of photography actions of AF including detecting the focus state of the photography optical system (focus detection), imaging, image processing, recording, and so forth. The camera CPU is equivalent to a computing device.

An imaging element control unit 16 controls the actions of the photoelectric conversion apparatus 10, and also performs A/D conversion pixel signals (imaging signals) output from the photoelectric conversion apparatus 10 and transmits these to the camera CPU. An image processing unit 17 generates image signals by performing image processing on the A/D converted imaging signals, such as γ correction and color interpolation and so forth, and further performs processing on the image signals such as JPEG compression and the like. A display unit 18 such as a liquid crystal display (LCD) or the like displays information relating to the shooting mode of the camera, a preview image before shooting, a configuration image after shooting, focus state at the time of performing focus detection, and so forth. Operating switches 19 are made up of a power switch, release (photography trigger) switch, zoom operating switch, shooting mode selection switch, and so forth. A recording medium 20 is for recording photographed images, and may be detachably mounted.

Figure 9B:
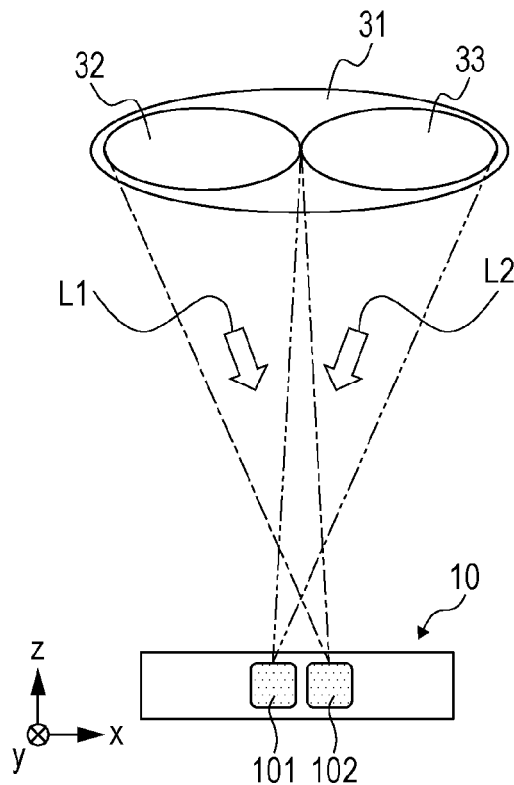

The following is a description of a focus detection method (pupil division) at the light receiving element 1 having the two photoelectric conversion portions 101 and 102. An exit pupil 31 of the imaging optical system illustrated in FIG. 9B is pupil-divided in the direction of the x direction, with the regions of the divided exit pupil being pupil regions 32 and 33. The light beams passing through the pupil regions 32 and 33 are respectively assigned to the two photoelectric conversion portions 101 and 102. The light receiving element 1 having the two photoelectric conversion portions 101 and 102 in the X direction that is illustrated in the present example has pupil dividing functions of performing pupil division in the X direction. Specifically, the photoelectric conversion portion 101 situated at the −X side receives a light beam W2 (indicated by a two-dot dashed line) which has passed through the +X side pupil region 33 in FIG. 9B. Also, the photoelectric conversion portion 102 situated at the +X side receives a light beam W1 (indicated by a single-dot dashed line) which has passed through the −X side pupil region 32 in FIG. 9B.

While a configuration for performing focus detection as to a subject having luminance distribution in the X direction has been described here, a solid-state imaging element where the photoelectric conversion portions 101 and 102 are arrayed in the Y direction can use the same configuration to be applied in the Y direction as well, and focus detection can be performed in the Y direction.

The embodiment described above can be modified as suitable without departing from the idea of the present invention.

According to the present invention, the precision of dividing light to multiple photoelectric conversion portions can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-114433, filed Jun. 2, 2014, which is hereby incorporated by reference herein in its entirety.

What is claimed is:
1. A photoelectric conversion apparatus comprising:
light receiving elements disposed along a first plane, wherein a light receiving element of the light receiving elements includes:
first and second photoelectric conversion portions arrayed along and below the first plane, and arrayed in an arrayed direction so that an isolation portion is disposed between the photoelectric conversion portions, and a light guide portion disposed above the first and the second photoelectric conversion portions so that the light guide portion overlaps the first and the second photoelectric conversion portions in an orthogonal direction orthogonal to the first plane, wherein, in at least a second plane, which is parallel to the first plane and which traverses the light guide portion, the light guide portion is surrounded by an insulating film and a refractive index of the light guide portion is higher than a refractive index of the insulating film, wherein the second plane has a first direction parallel to the arrayed direction and a second direction orthogonal to the first direction, and wherein, in the second plane, a width of the light guide portion in the first direction is larger than a width of the light guide portion in the second direction.

2. The photoelectric conversion apparatus according to claim 1, wherein in a third plane which is parallel to the first plane, which traverses the light guide portion, which is between the photoelectric conversion portions and the second plane, and which has a third direction parallel to the second direction, the light guide portion has a width in the third direction, and wherein the width of the light guide portion in the third direction in the third plane is smaller than the width of the light guide portion in the second direction in the second plane.

3. The photoelectric conversion apparatus according to claim 2, wherein in the third plane, the light guide portion has a width in a fourth direction parallel to the first direction, and wherein the width of the light guide portion in the fourth direction in the third plane is larger than the width of the light guide portion in the third direction in the third plane.

4. The photoelectric conversion apparatus according to claim 1, wherein the light receiving element further includes a single color filter disposed over the photoelectric conversion portions, wherein $WY \leq 3 \times \lambda/\sqrt{(n_1^2 - n_0^2)}$ or $WY \leq 2 \times \lambda/\sqrt{(n_1^2 - n_0^2)}$ is satisfied, where $n_1$ represents the refractive index of the light guide portion in the second plane, $n_0$ represents the refractive index of the insulating film surrounding the light guide portion, $\lambda$ represents a primary transmitting wavelength of the color filter, and WY represents the width of the light guide portion in the second direction in the second plane.

5. The photoelectric conversion apparatus according to claim 1, wherein the light receiving element further includes a light condensing portion disposed over the first and the second photoelectric conversion portions.

6. The photoelectric conversion apparatus according to claim 5, wherein the light receiving elements include a first light receiving element situated at a middle portion of a light receiving region where the light receiving elements are arrayed, and a second light receiving elements situated at a perimeter portion of the light receiving region, and wherein a distance between a center-of-gravity of the light condensing portion of the first light receiving element and a center-of-gravity of the light condensing portion of the second light receiving element is smaller than a distance between a center-of-gravity of the light guide portion of the first light receiving elements and a center-of-gravity of the light guide portion of the second light receiving element.

7. The photoelectric conversion apparatus according to claim 1, wherein the light guide portion includes a refractive index distribution that varies as a varying refractive index distribution.

8. The photoelectric conversion apparatus according to claim 1, wherein the width of the light guide portion in the first direction in the second plane is 1.05 times or more larger than the width of the light guide portion in the second direction in the second plane.

9. An imaging system comprising:

the photoelectric conversion apparatus according to claim 1; and a unit configured to perform imaging and focus detection by a phase shift detection method based on signals acquired from the light receiving elements.

10. The photoelectric conversion apparatus according to claim 1, wherein the light receiving element further includes:

a first lens corresponding to the photoelectric conversion portions, and a second lens disposed between the first lens and the light guide portion.

11. The photoelectric conversion apparatus according to claim 10, wherein a film, having a refractive index lower than the refractive index of the light guide portion, is disposed between the second lens and the light guide portion.

12. The photoelectric conversion apparatus according to claim 1, wherein an area of the light guide portion in a plane, which traverses the light guide portion, gradually becomes smaller from an entrance of the light guide portion to an exit of the light guide portion.

13. A photoelectric conversion apparatus comprising:

light receiving elements disposed along a first plane, wherein a light receiving element of the light receiving elements includes:

first and second photoelectric conversion portions arrayed along and below the first plane, and arrayed in an arrayed direction so that an isolation portion is disposed between the photoelectric conversion portions, and a light guide portion disposed above the first and second photoelectric conversion portions so that the light guide portion overlaps the first and the second photoelectric conversion portions in an orthogonal direction orthogonal to the first plane, wherein, in at least a second plane, which is parallel to the first plane and which traverses the light guide portion, and which has a first direction parallel to the arrayed direction and a second direction orthogonal to the first direction, a width of the light guide portion in the first direction is larger than a width of the light guide portion in a second direction orthogonal to the first direction, and wherein a width of the first and the second photoelectric conversion portions in the arrayed direction is larger than the width of the light guide portion in the second direction in the second plane.

14. The photoelectric conversion apparatus according to claim 13, wherein the light guide portion includes a material and is surrounded by an insulating film in the second plane, and wherein a film formed of the same material as the light guide portion covers the insulating film.

15. The photoelectric conversion apparatus according to claim 13, wherein a width of one of the photoelectric conversion portions in the arrayed direction is smaller than a width of the one of the photoelectric conversion portions in an orthogonal arrayed direction to the arrayed direction.

16. The photoelectric conversion apparatus according to claim 13, wherein a sum of each width of the photoelectric conversion portions and a distance between the photoelectric conversion portions in the arrayed direction is larger than the width of the light guide portion in the first direction in the second plane.

17. The photoelectric conversion apparatus according to claim 13, wherein the width of the light guide portion in the first direction in the second plane is the greatest value of lengths of line segments which are parallel to the first direction, wherein both ends of each of the line segments are situated on a perimeter of the light guide portion in the second plane, wherein the width of the light guide portion in the second direction in the second plane is the greatest value of the line segments which are parallel to the second direction, wherein both ends of each of the line segments are situated on the perimeter of the light guide portion in the second plane, wherein, in an entrance of the light guide portion, a width of the light guide portion in the first direction is larger than a width of the light guide portion in the second direction, and wherein, in an exit of the light guide portion, a width of the light guide portion in the first direction is larger than a width of the light guide portion in the second direction.

18. The photoelectric conversion apparatus according to claim 13, wherein in a third plane which is parallel to the first plane, which traverses the light guide portion, which is between the photoelectric conversion portions and the second plane, and which has a third direction parallel to the second direction, the light guide portion has a width in the third direction, and wherein the width of the light guide portion in the third direction in a third plane is smaller than the width of the light guide portion in the second direction in the second plane.

19. The photoelectric conversion apparatus according to claim 18, wherein in the third plane, the light guide portion has a width in a fourth direction parallel to the first direction, and wherein the width of the light guide portion in the fourth direction in the third plane is larger than the width of the light guide portion in the third direction in the third plane.

20. The photoelectric conversion apparatus according to claim 18, wherein in the third plane, the light guide portion has a width in a fourth direction parallel to the first direction, and wherein the width of the light guide portion in the fourth direction in the third plane is larger than the width of the light guide portion in the second direction in the second plane.

21. The photoelectric conversion apparatus according to claim 13, wherein the light receiving element includes a microlens, and a width of the microlens in a sixth direction parallel to the second direction is larger than the width of the light guide portion in the first direction in the second plane.

22. The photoelectric conversion apparatus according to claim 13, wherein the light receiving element further includes:

a first lens corresponding to the photoelectric conversion portions, and a second lens disposed between the first lens and the light guide portion.

23. An imaging system comprising:

the photoelectric conversion apparatus according to claim 13; and a unit configured to perform imaging and focus detection by a phase shift detection method based on signals acquired from the light receiving elements.

24. A photoelectric conversion apparatus comprising:

light receiving elements disposed along a first plane, wherein a light receiving element of the light receiving elements includes:

first and second photoelectric conversion portions arrayed along and below the first plane, and arrayed in an arrayed direction so that an isolation portion is disposed between the photoelectric conversion portions, and a light guide portion disposed above the first and the second photoelectric conversion portions so that the light guide portion overlaps the first and the second photoelectric conversion portions in an orthogonal direction orthogonal to the first plane, wherein a material of the light guide portion is resin, silicon nitride, silicon oxynitride, or titanium oxide, and wherein, in at least a second plane, which is parallel to the first plane and which traverses the light guide portion, and which has a first direction parallel to the arrayed direction and a second direction orthogonal to the first direction, a width of the light guide portion in the first direction are arrayed is larger than a width of the light guide portion in the second direction.

25. The photoelectric conversion apparatus according to claim 24, wherein a shape of the light guide portion in the second plane is an ellipse or a quadrangle with rounded corners.

26. An imaging system comprising:

the photoelectric conversion apparatus according to claim 24; and a unit configured to perform imaging and focus detection by a phase shift detection method based on signals acquired from the light receiving elements.

27. The photoelectric conversion apparatus according to claim 24, wherein the width of the light guide portion in the first direction in the second plane is 1.20 times or less smaller than the width of the light guide portion in the second direction in the second plane.

28. The photoelectric conversion apparatus according to claim 24, wherein the isolation portion disposed between the two photoelectric conversion portions is formed by a semiconductor region.

29. The photoelectric conversion apparatus according to claim 24, wherein the first direction is parallel to a straight line connecting a geometric center-of-gravity when viewing the first photoelectric conversion portion in plan view and a geometric center-of-gravity when viewing the second photoelectric portion in plan view, and wherein a fourth plane, which is between the second plane and the third plane and is parallel to the first plane, is between wiring layers, and the fourth plane is positioned halfway along a length of the light guide portion in a fifth direction orthogonal to the first direction and the second direction.

30. The photoelectric conversion apparatus according to claim 24, wherein the light receiving element further includes:
   a first lens corresponding to the photoelectric conversion portions, and
   a second lens disposed between the first lens and the light guide portion.

* * * * *